(12) United States Patent
Kim et al.

(10) Patent No.: US 9,349,747 B2
(45) Date of Patent: May 24, 2016

(54) SEMICONDUCTOR DEVICES HAVING GATE STACK PORTIONS THAT EXTEND IN A ZIGZAG PATTERN

(71) Applicants: Hyuk Kim, Seongnam-si (KR); Sang Wuk Park, Hwaseong-si (KR); Kyoung Sub Shin, Seongnam-si (KR)

(72) Inventors: Hyuk Kim, Seongnam-si (KR); Sang Wuk Park, Hwaseong-si (KR); Kyoung Sub Shin, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/676,843

(22) Filed: Apr. 2, 2015

(65) Prior Publication Data

US 2016/0064407 A1 Mar. 3, 2016

(30) Foreign Application Priority Data

Sep. 2, 2014 (KR) ........................ 10-2014-0116462

(51) Int. Cl.
| | | |
|---|---|---|
| *H01L 27/00* | (2006.01) | |
| *H01L 29/00* | (2006.01) | |
| *H01L 27/115* | (2006.01) | |
| *H01L 29/792* | (2006.01) | |
| *H01L 29/78* | (2006.01) | |
| *H01L 27/02* | (2006.01) | |

(52) U.S. Cl.
CPC ...... *H01L 27/11582* (2013.01); *H01L 27/0207* (2013.01); *H01L 27/11573* (2013.01); *H01L 29/7831* (2013.01); *H01L 29/7926* (2013.01)

(58) Field of Classification Search
CPC .................. H01L 27/11582; H01L 27/11573; H01L 27/0207; H01L 29/7831; H01L 29/7926; H01L 29/66833
See application file for complete search history.

(56) References Cited

U.S. PATENT DOCUMENTS

| | | | | |
|---|---|---|---|---|
| 8,189,360 | B2 | 5/2012 | Koyama | |
| 8,288,812 | B2 | 10/2012 | Kai et al. | |
| 8,455,940 | B2 * | 6/2013 | Lee ................... | H01L 27/11578 257/288 |
| 8,552,489 | B2 * | 10/2013 | Eom ................... | H01L 29/7926 257/324 |
| 8,685,821 | B2 * | 4/2014 | Eom ................... | H01L 29/7926 257/E21.209 |
| 2007/0268746 | A1 * | 11/2007 | Choi ................ | H01L 21/28273 365/185.05 |
| 2010/0329012 | A1 | 12/2010 | Koyama | |
| 2011/0316072 | A1 * | 12/2011 | Lee ................... | H01L 27/11551 257/329 |
| 2012/0156848 | A1 * | 6/2012 | Yang ................. | H01L 27/11529 438/287 |
| 2013/0009229 | A1 * | 1/2013 | Lee ................... | H01L 29/66833 257/314 |

(Continued)

FOREIGN PATENT DOCUMENTS

| | | |
|---|---|---|
| JP | 10-173147 | 6/1998 |
| JP | 2011-014610 | 1/2011 |

(Continued)

*Primary Examiner* — Nikolay Yushin
(74) *Attorney, Agent, or Firm* — Myers Bigel & Sibley, P.A.

(57) ABSTRACT

A semiconductor device includes a substrate having an upper surface extended in first and second directions perpendicular to each other, gate stack portions spaced apart from each other in the first direction, the gate stack portions including gate electrodes spaced apart from each other in a direction perpendicular to the an upper surface of the substrate and having lateral surfaces extended in the second direction to have a zigzag form, channel regions penetrating through the gate stack portions and disposed to form columns having a zigzag form in the second direction, at least two channel regions among the channel regions being linearly arranged in the first direction within the respective gate stack portion, and a source region disposed between the gate stack portions adjacent to each other and extended in the second direction to have a zigzag form.

20 Claims, 22 Drawing Sheets

(56) References Cited

U.S. PATENT DOCUMENTS

| | | |
|---|---|---|
| 2013/0009236 A1 | 1/2013 | Lee et al. |
| 2013/0107629 A1 | 5/2013 | Shim et al. |
| 2013/0134493 A1 | 5/2013 | Eom et al. |
| 2013/0201758 A1 | 8/2013 | Kim et al. |
| 2013/0248974 A1 | 9/2013 | Alsmeier et al. |
| 2013/0270623 A1 | 10/2013 | Suzuki et al. |
| 2013/0334702 A1 | 12/2013 | Lee |

FOREIGN PATENT DOCUMENTS

| | | |
|---|---|---|
| JP | 2011-192879 | 9/2011 |
| KR | 1020080082353 A | 9/2008 |
| KR | 1020130007703 | 1/2013 |
| KR | 10201300597821 | 6/2013 |
| KR | 1020130139610 | 12/2013 |
| KR | 1020140020139 A | 2/2014 |

* cited by examiner

SEMICONDUCTOR DEVICES HAVING GATE STACK PORTIONS THAT EXTEND IN A ZIGZAG PATTERN

CROSS-REFERENCE TO RELATED APPLICATION

This application claims priority under 35 U.S.C. §119 from Korean Patent Application No. 10-2014-0116462, filed on Sep. 2, 2014 in the Korean Intellectual Property Office, the disclosure of which is incorporated herein by reference in its entirety.

BACKGROUND

Electronic products are expected to store and process increasingly large amounts of data while at the same time the sizes of these electronic products are being reduced. As such, the degree of integration of the semiconductor devices used in such electronic products is being increased. In order to further increase the degree of integration, semiconductor devices having a vertical transistor structure have been proposed.

SUMMARY

Embodiments of the inventive concepts may provide semiconductor devices having improved reliability.

According to some embodiments of the inventive concepts, a semiconductor device may include: a substrate having an upper surface that extends in first and second directions that are perpendicular to each other; first and second gate stack portions that are spaced apart from each other in the first direction, the first and second gate stack portions including gate electrodes that are spaced apart from each other in a third direction that is perpendicular to the upper surface of the substrate, the first and second gate stack portions having lateral surfaces that extend in the second direction in a zigzag pattern; channel regions that penetrate the first and second gate stack portions, the channel regions arranged in columns that extend in the second direction in a zigzag pattern, wherein the first gate stack portion and the second gate stack portions each includes at least two channel regions that are linearly arranged in the first direction; and a source region disposed between the first and second gate stack portions, the source region extending in the second direction in a zigzag pattern.

The lateral surfaces of the first and second gate stack portions extend in fourth and fifth directions, each of which is inclined with respect to both the first direction and the second direction.

The first and second gate stack portions may be positioned so that a virtual line that extends in the second direction intersects both the first and second gate stack portions.

The channel regions may include a first channel region in the first gate stack portion and a second channel region in the second gate stack portion, and at least portions of the first channel region and the second channel region may be linearly disposed in the second direction.

The first channel region may be positioned in an outermost portion of the first gate stack portion along the first direction and the second channel region may be positioned in an outermost portion of the second gate stack portion along a direction opposite to the first direction.

The number of channel regions that are linearly disposed in the first direction may be 2n in each of the first and second gate stack portions, n being a natural number.

The channel regions that penetrate the first gate stack portion may be linearly arranged alternately in fourth and fifth directions that are different from the first and second directions, and the channel regions that penetrate the second gate stack portion may be linearly arranged alternately in fourth and fifth directions.

The number of the channel regions that are continuously linearly arranged in the fourth direction or in the fifth direction may be five or more in each of the first and second gate stack portions.

The numbers of the channel regions that are continuously linearly arranged the fourth direction and in the fifth direction may be equal to each other in the first gate stack portion and in the second gate stack portion.

Each of the first and second gate stack portions may include a plurality of first protrusion regions that each protrudes in the first direction and a plurality of second protrusion regions that each protrudes in a direction opposite to the first direction, and the first and second protrusion regions may be alternately disposed in the second direction.

The source region may be in the substrate, and the semiconductor device may further include a common source line on the source region that extends in the second direction in a zigzag pattern.

The semiconductor device may further include: a plurality of channel pads on upper portions of the respective channel regions; a plurality of first contact plugs that are connected to the respective channel pad; a plurality of connection wiring lines each of which is connected to at least one of the first contact plugs; a plurality of second contact plugs that are connected to respective ones of the connection wiring lines; and a plurality of bit lines that are connected to respective ones of the second contact plugs and that extend in the first direction.

The connection wiring lines may connect two of the channel regions respectively located within the gate stack portions adjacent to each other and adjacent to each other in the first direction to each other.

The bit line may be electrically connected to only one channel region among the channel regions disposed within the respective gate stack portion.

According to other embodiments of the inventive concepts, a semiconductor device may include: a substrate having an upper surface that extends in a first direction and a second direction that is perpendicular to the first direction, a gate stack portion including gate electrodes that are spaced apart from each other in a third direction that is perpendicular to the upper surface of a substrate, the gate stack portion extending in the second direction in a zigzag pattern; and channel regions that penetrate the gate stack portion to extend to the upper surface of the substrate, the channel regions arranged in columns that extend in a zigzag pattern in the second direction, at least two of the channel regions being disposed linearly in the first direction.

According to further embodiments of the inventive concepts, three-dimensional semiconductor memory devices are provided that include a substrate that has an upper surface that extends in a first direction and a second direction that is perpendicular to the first direction, a plurality of gate stack portions, each gate stack portion including a plurality of channel regions that extend upwardly from the upper surface of the substrate, each gate stack portion having lateral surfaces that extend in the second direction in a zigzag pattern, and a plurality of source regions, each source region separating adjacent ones of the gate stack portions, each source region extending in the second direction in a zigzag pattern.

The channel regions in each gate stack portion may be arranged in linear rows that extend in the first direction.

The lateral surfaces of each gate stack pattern may alternately extend in a fourth direction that is inclined by an angle of less than ninety degrees with respect to the first direction and in a fifth direction that is inclined by an angle of more than ninety degrees with respect to the first direction.

Five or more channel regions may be continuously linearly arranged in the fourth direction in each of the gate stack patterns.

Adjacent gate stack portions may be positioned so that a virtual line that extends in the second direction intersects both adjacent gate stack portions.

BRIEF DESCRIPTION OF DRAWINGS

The above and other aspects, features and advantages of the inventive concepts will be more clearly understood from the following detailed description taken in conjunction with the accompanying drawings, in which.

DETAILED DESCRIPTION

Figure 1:
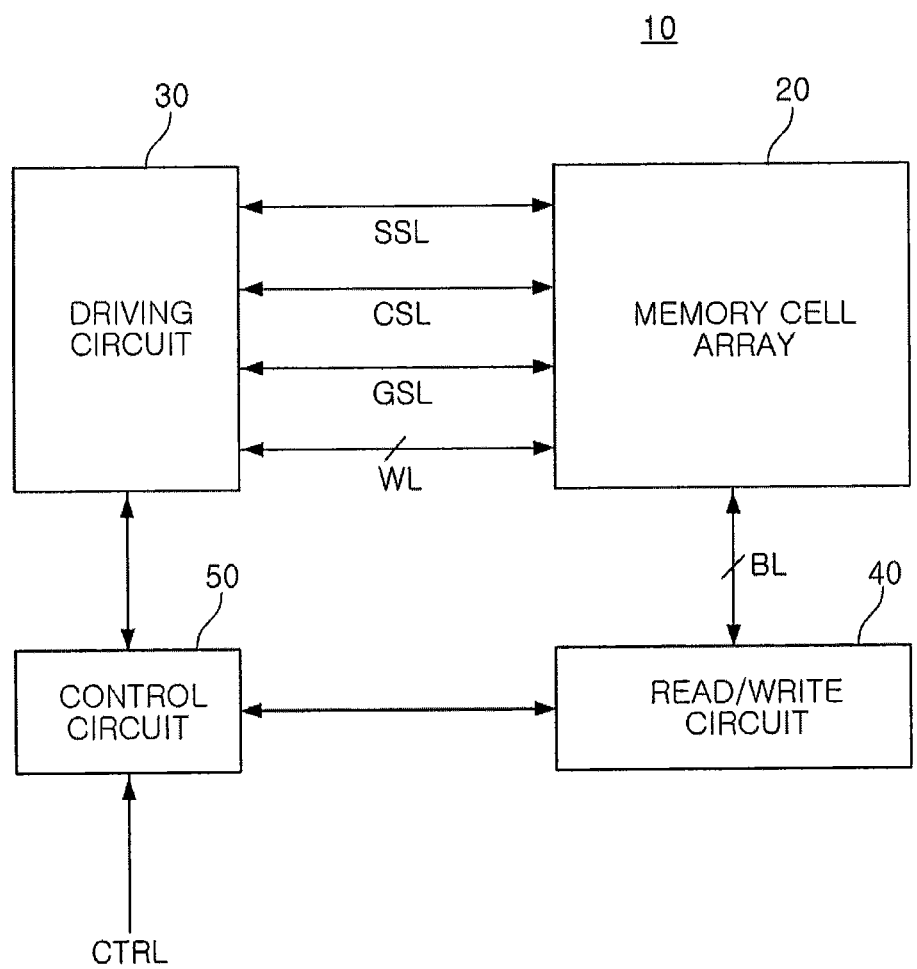
FIG. 1 is a schematic block diagram of a semiconductor device according to an exemplary embodiment of the inventive concepts.

Embodiments of the inventive concepts will now be described in detail with reference to the accompanying drawings. The inventive concepts may, however, be exemplified in many different forms and should not be construed as being limited to the specific embodiments set forth herein. Rather, these embodiments are provided so that this disclosure will be thorough and complete, and will fully convey the scope of the inventive concepts to those skilled in the art.

In the drawings, the shapes and dimensions of elements may be exaggerated for clarity, and the same reference numerals are used throughout to designate the same or like elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items. As used herein, the singular forms "a", "an" and "the" are intended to include the plural forms as well, unless the context clearly indicates otherwise. The terms "comprise" and/or "comprising" will be understood to imply the inclusion of stated constituents, steps, operations and/or elements but not the exclusion of any other constituents, steps, operations and/or elements.

FIG. 1 is a schematic block diagram of a semiconductor device 10 according to an exemplary embodiment of the inventive concepts.

As shown in FIG. 1, the semiconductor device 10 may include a memory cell array 20, a driving circuit 3Q, a read/write circuit 40, and a control circuit 50.

The memory cell array 20 may include a plurality of memory cells, which may be arranged in rows and columns. The memory cells included in memory cell array 20 may be connected to the driving circuit 30 through word lines WL, common source lines CSL, string selection lines SSL, ground selection lines GSL, and the like, and may be connected to the read/write circuit 40 through bit lines BL. In exemplary embodiments, a plurality of memory cells that are arranged in a single row may be connected to, for example, a single word line WL, and a plurality of memory cells that are arranged in a single column may be connected to a single bit line BL.

The memory cells included in the memory cell array 20 may be divided into a plurality of memory blocks. A respective memory block may include a plurality of word lines WL, a plurality of string selection lines SSL, a plurality of ground selection lines GSL, a plurality of bit lines BL, and at least one common source line CSL.

The driving circuit 30 and the read/write circuit 40 may be operated by the control circuit 50. In an exemplary embodiment, the driving circuit 30 may receive externally provided address information, and may decode the received address information and select at least a portion of a word line WL, a common source line CSL, a string selection line SSL, and a ground selection line GSL that is connected to the memory cell array. The driving circuit 30 may include a driving circuit for each of the word lines WL, the string selection lines SSL, and the common source line CSL.

The read/write circuit 40 may select at least a portion of bit lines BL that are connected to the memory cell array 20 in response to a command provided from the control circuit 50. The read/write circuit 40 may read data written to a memory cell that is connected to the selected bit lines BL (or portions thereof) or may write data to a memory cell that is connected to the selected bit lines BL (or portions thereof). The read/write circuit 40 may include circuits such as a page buffer, an input/output buffer, a data latch, or the like.

The control circuit 50 may control operations of the driving circuit 30 and the read/write circuit 40 in response to a control signal CTRL that is provided from an external source. In the case of reading data from the memory cell array 20, the control circuit 50 may control operations of the driving circuit 30 to supply a voltage for the read operation to the word line WL that is connected to memory cells in which the data to be read is stored. When the voltage for the read operation is supplied to a specific word line WL, the control circuit 50 may control operations of the semiconductor memory device 10 so that data written to memory cells that are connected to the word line WL that received the voltage for a read operation are read.

When data is written to the memory cell array 20, the control circuit 50 may control operations of the driving circuit 30 to supply a voltage to a word line WL to which the data is to be written as part of the writing (or "programming") operation. When the voltage for the writing operation is supplied to a specific word line WL, the control circuit 50 may control the read/write circuit 40 to write data to the memory cells that are connected to the word like WL to which the voltage has been supplied for the write operation.

Figure 2:
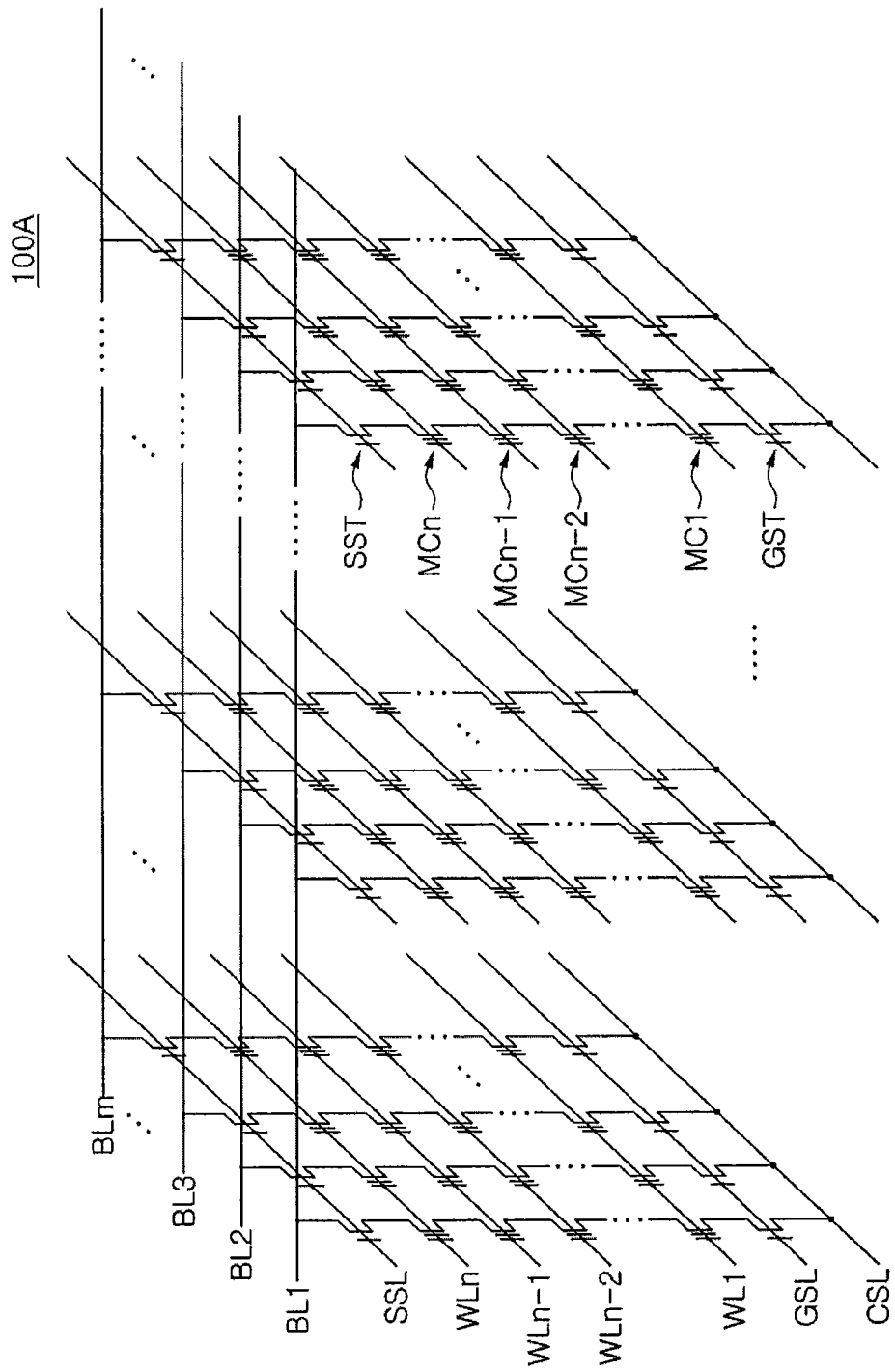
FIG. 2 is an equivalent circuit diagram of a memory cell array of a semiconductor device according to an exemplary embodiment of the inventive concepts.

FIG. 2 is an equivalent circuit diagram of a memory cell array of semiconductor devices according to exemplary embodiments of the inventive concepts.

FIG. 2 is an equivalent circuit diagram illustrating a three-dimensional structure of memory cell array included in a vertical semiconductor device 100A. Referring to FIG. 2, the memory cell array may include a plurality of memory cell strings that each include n memory cells MC1 to MCn that are electrically connected to one another in series, and a ground selection transistor GST and a string selection transistor SST that are connected in series to respective ends of each memory cell string so that the n memory cells MC1 to MCn are between the ground selection transistor GST and the string selection transistor SST of each string.

The memory cells MC1 to MCn in each memory cell string may be connected to word lines WL1 to WLn that may be used to select at least a portion of the memory cells MC1 to MCn.

Gate terminals of the ground selection transistors GST may be connected to a ground selection line GSL, and source terminals thereof may be connected to a common source line CSL. Gate terminals of the string selection transistors SST may be connected to a string selection line SSL, and source terminals thereof may be connected to drain terminals of the memory cells MCn of the memory cell strings. Although FIG. 2 illustrates a structure in which one ground selection transistor GST and one string selection transistor SST are included in each memory cell string, it will be appreciated that in other embodiments a plurality of ground selection transistors GST and/or a plurality of string selection transistors SST may be provided in some or all of the memory cell strings.

Drain terminals of each string selection transistor SST may be connected to one of the bit lines BL1 to BLm. When a signal is applied to the gate terminal of one of the string selection transistors SST through the string selection line SSL, the signal applied through the bit line BL1 to BLm that is connected to the string selection transistor SST may be transferred to the memory cells MC1 to MCn of the memory cell string that includes the string selection transistor SST so that a data read operation or a data writing operation may be performed. In addition, as a signal is applied to a gate terminal of the ground selection transistor GST which has a source terminal that is connected to the common source line CSL, via the ground selection line, an erase operation in which charges stored in the memory cells MC1 to MCn are removed may be performed.

Figure 3:
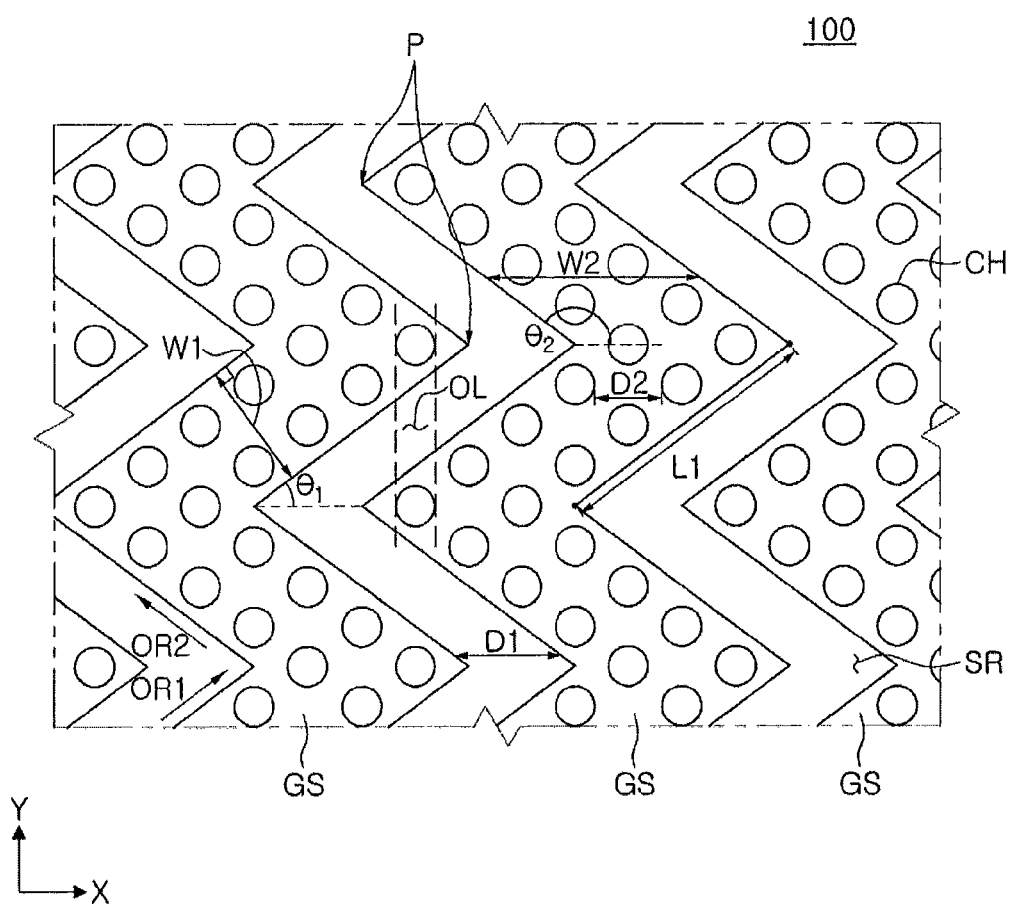
FIG. 3 is a schematic plan view of a semiconductor device according to an exemplary embodiment of the inventive concepts.

FIG. 3 is a schematic plan view of a semiconductor device according to an exemplary embodiment of the inventive concepts.

The schematic plan view of FIG. 3 illustrates a portion of constituent elements of a memory cell array region included in a vertical semiconductor device 100. The semiconductor device 100 may include gate stack portions GS, a plurality of channel regions CH that penetrate the gate stack portions GS, and source regions SR that extend in a direction macroscopically, for example, in a Y direction. The source regions SR may be provided between the gate stack portions GS.

The gate stack portion GS may include gate electrodes of the memory cells MC1 to MCn, the ground selection transistors GST and the string selection transistors SST that were described above with reference to FIG. 2. The channel regions CH may include channel regions of the memory cells MC1 to Men, the ground selection transistors GST and the string selection transistors SST.

The gate stack portions GS may include gate electrodes of transistors of a plurality of memory cell arrays that are stacked in a direction that is not illustrated in the drawing. The gate stack portions GS may be spaced apart from one another by a predetermined distance. In addition, the gate stack portions GS may extend in the Y direction in a zigzag pattern and may have lateral surfaces that are inclined with respect to the X and Y directions. Herein, an element such as a gate stack portion GS may be considered to extend in a first direction in a zigzag pattern if the element is comprised of segments that are arranged end-to-end and that alternately veer in opposed directions to form a structure that extends in the first direction along a crooked path. The "lateral surface" of a gate stack portion GS refers to a surface that extends along a plane in a direction perpendicular with respect to the X and Y directions and may indicate a surface perpendicular to an upper surface of a substrate 101 of FIG. 4 (i.e., the Z direction in FIG. 4). By providing gate stack portions GS having lateral surfaces that are inclined with respect to the X and Y directions, a tendency of the gate stack portion OS to lean may be reduced or prevented. The gate stack portions GS may extend in the Y direction and may be connected to circuits of a peripheral circuit region in a region not illustrated in FIGS. 3 and 4.

As shown in FIG. 3 each gate stack portion GS may have protrusion regions P that alternately protrude in the X direction and in a direction opposite the X direction (i.e., the −X direction). These protrusion regions P may extend toward the gate stack portions GS that are on either side of the gate stack portion OS at issue. At least a portion of the protrusion regions P of two adjacent gate stack portions GS may be disposed linearly in the Y direction.

The gate stack portion GS may extend in a first direction OR1 and a second direction OR2 to have a zigzag pattern. The first direction OR1 and the second direction OR2 are each different from the X direction and the Y direction. The gate stack portion GS may extend in a zigzag pattern to correspond to an arrangement of the channel regions CH that are disposed in a zigzag pattern in the interior thereof. The gate stack portion GS may extend in the first direction OR1 at a first angle θ1 with respect to the X direction and may extend in the second direction OR2 at a second angle θ2 with respect to the X direction. The first angle θ1 may be less than 90 degrees, and the second angle θ2 may be greater than 90 degrees. The first angle θ1 may, for example, may be between 30 degrees and 60 degrees, and the second angle θ2 may, for example, be between 120 degrees and 150 degrees. The first angle θ1 may or may not be equal to the second angle θ2 plus 90 degrees. A length L1 of a portion of the gate stack portion GS that extends continuously in the first direction OR1 or in the second direction OR2 may be at least twice a minimum width W1 of the gate stack portions OS, and may be determined based on, for example, a degree of integration of the semiconductor device 100.

The gate stack portions GS that are adjacent to each other in the X direction may be spaced apart from each other by a substantially uniform distance D1 in the X direction. The distance D1 may be less than a width W2 of the gate stack portion GS in the X direction.

Figure 4:
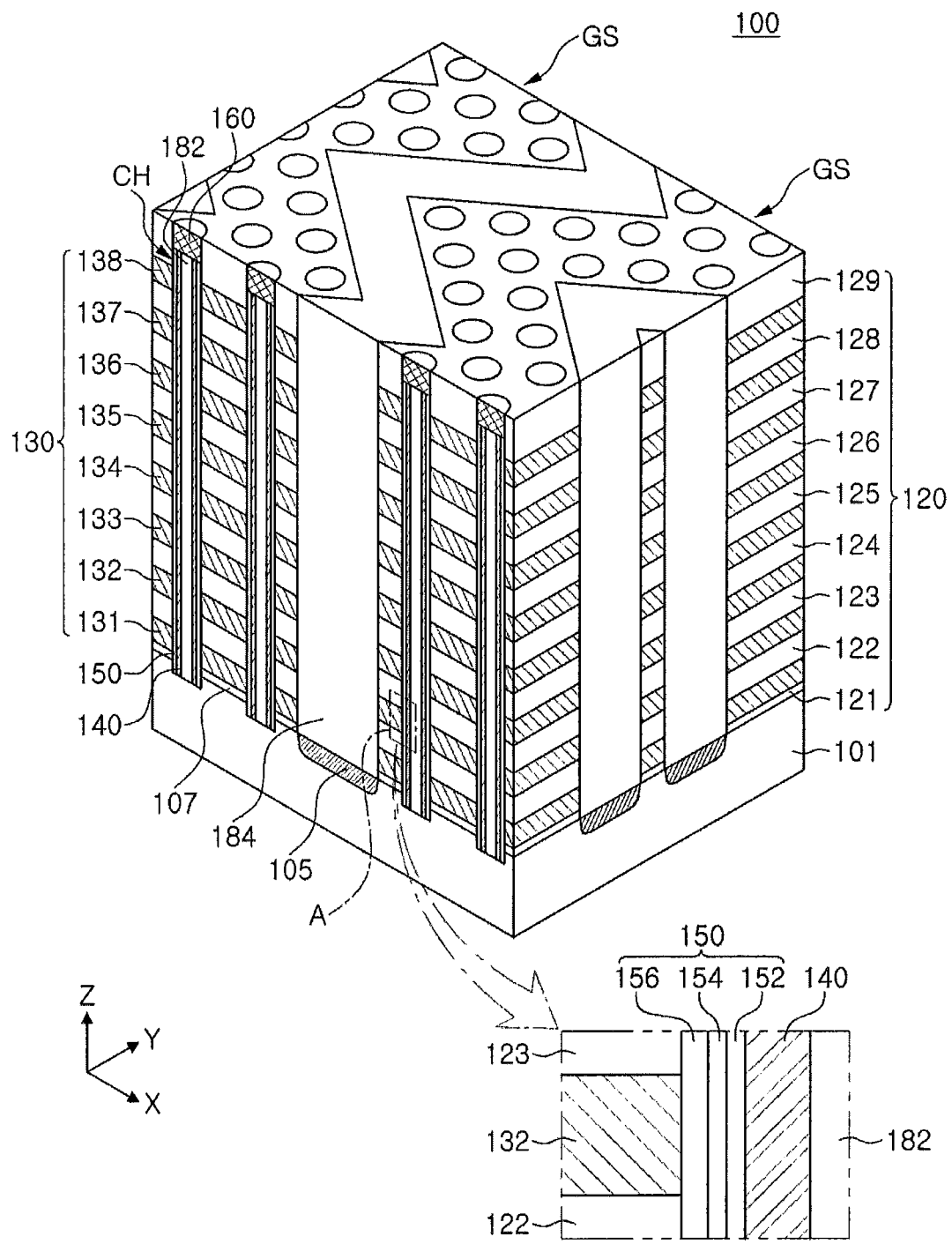
FIG. 4 is a schematic perspective view illustrating the structure of memory cell strings of a semiconductor device according to exemplary embodiments of the inventive concepts.

As shown in FIG. 4, the channel regions CH may vertically penetrate through the gate stack portion GS, and within each gate stack portion GS, two channel regions CH may be disposed linearly in parallel in the X direction and may be disposed in two columns that extend in a zigzag pattern in the Y direction. In the semiconductor device 10Q, single memory cell strings may be configured for respective channel regions CH.

A maximum of "m" channel regions may be arranged in the first and second directions OR1 and OR2. For example, when the number of channel regions CH that are linearly arranged in the X direction within a single gate stack portion GS is 2n (n being a natural number), m may be 4n or more, but is not limited thereto. When m is relatively small, a degree of integration of a memory cell region may be reduced. In some embodiments, m may be 5n or more to provide increased integration density. FIG. 3 illustrates a case in which n is 1 and m is 6 by way of example so that m is 6n.

Channel regions CH that are adjacent each other along the X direction may be spaced apart from each other by a predetermined distance D2 within a single gate stack portion GS. As shown in FIG. 3, at least some of the channel regions CH that are disposed within different gate stack portions GS may be located in regions OL that extend in the Y direction. The channel regions CH that are disposed within the region OL may be channel regions CH that are disposed in outermost positions of the gate stack portions GS in the X direction and in a direction opposite thereto (i.e., the −X direction). In detail, at least some of the channel regions CH that are disposed within different gate stack portions GS may be aligned in the Y direction. In further detail, at least some of the channel regions CH that are disposed within different gate stack portions GS may be arranged so that a virtual line that extends in the Y direction passes through channel regions CH that are disposed within different gate stack portions GS.

In addition, in exemplary embodiments, some of the channel regions CH may be dummy channel regions. The term 'dummy' refers to a structure that has a shape that is the same as or similar to other constituent elements, but the structure is only used for a configuration existing as a pattern, without actually performing a function within the semiconductor device 100. Thus, an electrical signal may not be applied to a 'dummy' constituent element or even in a case in which an electrical signal is applied thereto, the 'dummy' constituent element may not perform an electrically equivalent function. The channel regions CH may be variously disposed according to exemplary embodiments, and a detailed description thereof will be provided with reference to FIGS. 6 to 8.

Each source region SR may be disposed between two adjacent gate stack portions GS so that the source regions SR serve to space adjacent gate stack portions apart from each other. Each source region SR may extend in the Y direction. Each source region SR may also be formed in a zigzag pattern to correspond to the shapes of the adjacent gate stack portions GS. In some embodiments, a common source line CSL (see FIG. 2) or a contact plug connected to the common source line CSL may be disposed on an upper portion of each source region SR.

FIG. 4 is a schematic perspective view illustrating a structure of memory cell strings of a semiconductor device 100 according to exemplary embodiments of the inventive concepts. FIG. 4 only illustrates some of the constituent elements, and thus it will be appreciated that other elements of the semiconductor device such as, for example, upper wirings, have been omitted for convenience.

With reference to FIG. 4, the semiconductor device 100 may include a substrate 101, a plurality of channel layers 140 that are disposed in a direction perpendicular to an upper surface of the substrate 101 (i.e., the Z direction in FIG. 4), a plurality of interlayer insulating layers 121-129 (which are collectively referred to as the insulating layers 120) and a plurality of gate electrodes 131-138 that are stacked along an outer wall of the channel layers 140 (the gate electrodes 131-138 are collectively referred to as the gate electrodes 130). In addition, the semiconductor device 100 may further include gate dielectric layers 150 that are disposed between each channel layer 140 and its respective gate electrode 130, channel pads 160 that are disposed on the respective channel layers 140, and source regions 105.

In the semiconductor device 100, one memory cell string may correspond to a respective channel layer 140. The memory cell strings may be arranged in columns and rows in the X direction and the Y direction. The gate stack portions GS described above with reference to FIG. 3 may include gate electrodes 130, and the channel regions CH may include channel layers 140. The source region SR of FIG. 3 may include the source region 105.

The substrate 101 may have an upper surface that extends in the X direction and the Y direction. The substrate 101 may comprise a semiconductor material. In example embodiments, the substrate 101 may be any of a group IV semiconductor substrate, a group III-V compound semiconductor substrate, or a group II-VI oxide semiconductor substrate. For example, the group IV semiconductor may include silicon, germanium, or silicon-germanium. The substrate 101 may also be provided as a bulk wafer or may comprise an epitaxial layer.

Pillar-shaped channel layers 140 extend from the substrate 101 in the Z direction and hence may be perpendicular to an upper surface of the substrate 101. The channel layers 140 may each have an annular shape to surround a first insulating layer 182 provided in the interior thereof. Alternatively, the channel layers 140 may have a pillar shape such as a cylindrical shape or a prism shape in which the first insulating layer 182 is omitted. In addition, the channel layers 140 may have an inclined lateral surface tapered toward the substrate 101 according to an aspect ratio.

The channel layers 140 may be spaced apart from each other in the X and Y directions and may be disposed in columns that extend in the Y direction in a zigzag pattern. However, the channel layers 14Q are not limited thereto. Some of the channel layers 140 may be dummy channel layers.

A lower surface of each channel layer 140 may be connected to the substrate 101. Each channel layer 140 may include a semiconductor material such as polycrystalline silicon or single crystalline silicon, and the semiconductor material may be a non-doped material or may be doped with p-type or n-type impurities.

A plurality of gate electrodes 131 to 138 (130) may be spaced apart from one another and from the substrate 101 in the Z direction, along a respective lateral surface of the channel layer 14Q. With reference to FIGS. 2 and 4, the gate electrodes 130 may form the gates of the ground selection transistors GST, the memory cells MC1 to MCn, and the string selection transistors SST. The gate electrodes 130 may extend to form the word lines WL1 to WLn, and may be commonly connected to each other between memory cell strings arranged in the X direction and in the Y direction to be adjacent each other with a predetermined distance therebetween. In exemplary embodiments, gate electrode 131 may form the gates of the ground selection transistors GST, gate electrodes 132 to 136 may form the gates of five memory cells MC1 to MCn in each memory cell string, and gate electrodes 137 and 138 may form the gates of the string selection transistors SST, but the gate electrodes are not limited thereto. In example embodiments, the number of the gate electrodes 130 configuring the memory cells MC1 to MCn may be $2^n$, where n is a natural number.

The gate electrode 131 of the ground selection transistor GST may extend in the Y direction to form the ground selection line GSL. In order to implement the ground selection transistor GST function, the substrate 101 may be doped below the gate electrode 131 using a predetermined impurity.

The gate electrodes 137 and 138 of the string selection transistors SST may extend in the Y direction to form the string selection line SSL. The gate electrodes 137 and 138 of the string selection transistors SST may be connected to each other between adjacent memory cell strings in the X direction, and the adjacent memory cell strings may be connected to different bit lines BL1 to BLm (see FIG. 2), respectively, via a wiring structure in an upper portion thereof, that is not shown in the drawings. A detailed description thereof will be described below with reference to FIGS. 16A to 17B. In exemplary embodiments of the present disclosure, the gate electrodes 137 and 138 of the string selection transistors SST may also be formed to be separated from each other between memory cell strings that are adjacent each other in the X direction, to thus form different string selection lines SSL. In some embodiments, the gate electrodes 137 and 138 of the string selection transistors SST and the gate electrode 131 of the ground selection transistors GST may be provided as one, or two or more, respectively, and may also have a structure different from that of the gate electrodes 132 to 136 of the memory cells MC1 to MCn.

In addition, some of the gate electrodes 130 such as, for example, the gate electrodes 130 that are adjacent the gate electrode 131 of the ground selection transistor GST or the gate electrodes 137 and 138 of the string selection transistor SST may be dummy gate electrodes. For example, the gate electrode 132 that is adjacent the gate electrode 131 of the ground selection transistor GST may be a dummy gate electrode in some embodiments.

In some embodiments, the gate electrodes 13Q may comprise polycrystalline silicon or a metal silicide material. The metal silicide may be, for example, a silicide of a material selected from among cobalt (Co), nickel (Ni), hafnium (Hf), platinum (Pt), tungsten (W) and titanium (Ti), or may be a combination thereof. In some embodiments, the gate electrodes 130 may also include a metal such as, for example, tungsten (W). In addition, although not illustrated in the drawings, the gate electrodes 130 may further include a diffusion barrier layer. In some such embodiments the diffusion barrier layer may include tungsten nitride (WN), tantalum nitride (TaN), titanium nitride (TiN) or a combination thereof.

A plurality of interlayer insulating layers 121 to 129 (120) may be provided between the gate electrodes 130. The interlayer insulating layers 120 may be spaced apart from one another in the Z direction in the same manner as that of the gate electrodes 130 and may extend in the Y direction. The interlayer insulating layers 120 may include an insulation material such as, for example, silicon oxide or silicon nitride.

A gate dielectric layer 150 may be disposed between the gate electrodes 13Q and the channel layers 140. As illustrated in the enlarged view of region "A" of FIG. 4, the gate dielectric layer 150 may include a tunneling layer 152, a charge storage layer 154, and a blocking layer 156 that are sequentially stacked on the channel layer 140. In some embodiments, the gate dielectric layer 150 may extend along a length of the channel layer 140 and hence may extend perpendicular to an upper surface of the substrate 101.

The tunneling layer 152 may be configured to allow charges to tunnel into the charge storage layer 154 via a Fowler-Nordheim (F-N) tunneling mechanism. The tunneling layer 152 may include, for example, silicon oxide. The charge storage layer 154 may act as a charge trapping layer or a floating gate conductive layer. In example embodiments, the charge storage layer 154 may include a dielectric material, quantum dots, or nanocrystals. The quantum dots or nanocrystals may be conductive quantum dots or nanocrystals that are formed of, for example, a metal or semiconductor material. In exemplary embodiments, when the charge storage layer 154 is provided as a charge trapping layer, the charge storage layer 154 may be formed using silicon nitride. The blocking layer 156 may include a high-k dielectric material. Herein, a high-k dielectric material refers to a dielectric material that has a dielectric constant higher than that of silicon dioxide.

In an upper end portion of the memory cell string, a channel pad 160 may be disposed to cover an upper surface of the first insulating layer 182. The channel pad 16Q may be electrically connected to the channel layer 140. The channel pad 160 may include, for example, doped polycrystalline silicon. The channel pad 160 may serve as a drain region of the string selection transistor SST (see FIG. 2). The channel pads 160 may be electrically connected to the bit lines BL1 to BLm (see FIG. 2), and a conductive contact plug may be further disposed between each channel pad 160 and the respective bit line BL1 to BLm to which it is connected.

In a lower end portion of the memory cell string, source regions 105 of the ground selection transistors GST (see FIG. 2) may be provided. The source regions 105 may extend in the Y direction. The source regions 105 may be formed, for example, in an upper surface of the substrate 101, and may be spaced apart from one another in the X direction. In some embodiments, one source region 105 may be provided for every two channel layers 140 that are disposed in the X direction, but embodiments of the inventive concepts are not limited thereto. A second insulating layer 184 may be disposed on the source region 105. In exemplary embodiments, a conductive layer forming a contact plug may be connected to a common source line CSL (see FIG. 2) or the common source line CSL may be disposed on the source region 105. The conductive layer may include, for example, tungsten (W), aluminum (Al) or copper (Cu).

When the source region 105 has a conductivity type opposite that of the substrate 101, the source region 105 may act as a source of a ground selection transistor GST adjacent thereto. When the source region 105 has the same conductivity type as that of the substrate 101, the source region 105 may also act as a pocket P well contact for an erase operation in a block unit of memory cell strings. In this case, a high voltage may be applied to the substrate 101 through the pocket P well contact and data stored in all of memory cells within a corresponding memory cell block of the substrate 101 may be erased.

Figure 5A:
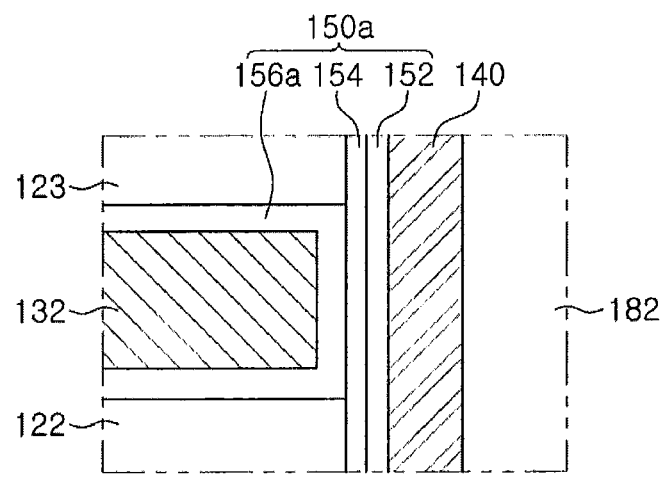
FIGS. 5A to 5C are cross-sectional views illustrating gate dielectric layers according to exemplary embodiments of the inventive concepts.
Figure 5B:
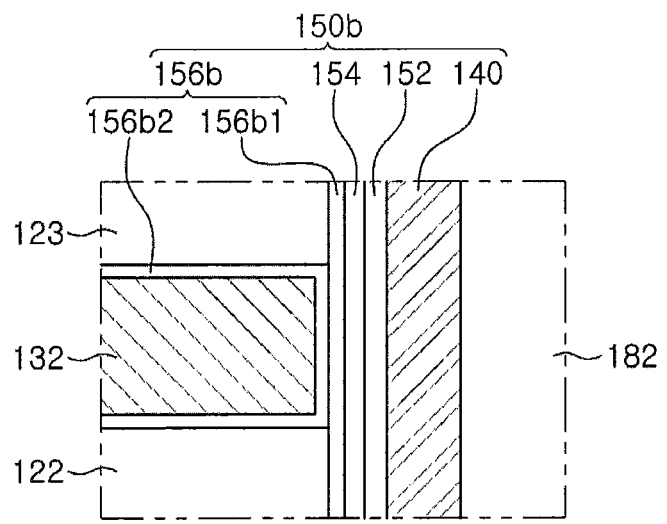
Figure 5C:
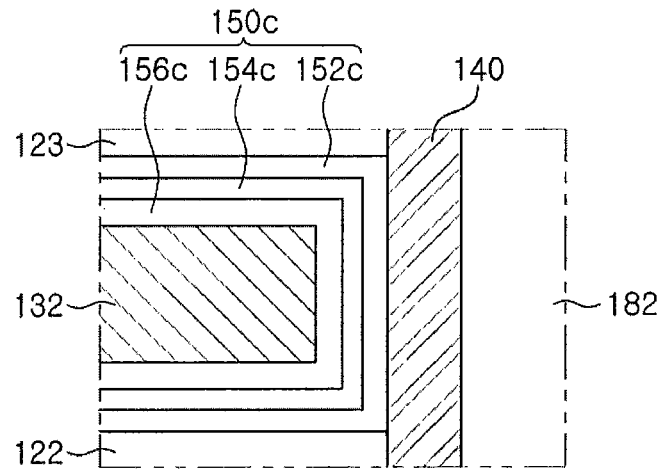

FIGS. 5A to 5C are cross-sectional views illustrating gate dielectric layers according to exemplary embodiments of the inventive concepts. In particular, FIGS. 5A-5C illustrate the region 'A' of FIG. 4 for various gate dielectric layer implementations according to example embodiments of the inventive concepts. While FIGS. 5A-5C only illustrate portions of the gate dielectric layer that are adjacent a single gate electrode, it will be appreciated that the gate dielectric layer may have the same arrangements around the other gate electrodes.

With reference to FIG. 5A, a gate electrode 132, a gate dielectric layer 150a and a channel layer 140 of a memory cell string are illustrated. The gate dielectric layer 150a may have a structure in which a tunneling layer 152, a charge storage layer 154, and a blocking layer 156a are sequentially stacked on a channel layer 140. Relative thicknesses of the layers forming the gate dielectric layer 150a are not limited to the thicknesses shown in the drawings.

In detail, in the gate dielectric layer 150a of FIG. 5A, the tunneling layer 152 and the charge storage layer 154 may extend vertically along a length of the channel layer 140, while the blocking layer 156a may surround at least a portion of the gate electrode 132.

The tunneling layer 152 may include, for example, silicon dioxide ($SiO_2$), silicon nitride ($Si_3N_4$), silicon oxy-nitride (SiON), or a combination thereof.

The charge storage layer 154 may be a charge trapping layer or a floating gate conductive layer. For example, when the charge storage layer 154 is a floating gate conductive layer, the charge storage layer 154 may be formed by depositing polycrystalline silicon via, for example, low pressure chemical vapor deposition (LPCVD). When the charge storage layer 154 is a charge trapping layer, the charge storage layer 154 may include, for example, $SiO_2$, $Si_3N_4$, SiON, $HfO_2$, $ZrO_2$, $Ta_2O_3$, $TiO_2$, $HfAl_xO_y$, $HfSi_xO_y$, $HfSi_xO_y$, $Al_xN_y$, $AlGa_xN_y$, or a combination thereof.

The blocking layer 156a may include $SiO_2$, $Si_3N_4$, SiON, a high-k dielectric material, or a combination thereof. The high-k dielectric material may be one of $Al_2O_3$, $Ta_2O_3$, $TiO_2$, $Y_2O_3$, $ZrO_2$, $ZrSi_xO_y$, $HfO_2$, $HfSi_xO_y$, $La_2O_3$, $LaAl_xO_y$, $LaHf_xO_y$, $HfAl_xO_y$, and $Pr_2O_3$.

With reference to FIG. 5B, a gate electrode 132, a gate dielectric layer 150b, and a channel layer 140 of a memory cell string are illustrated. The gate dielectric layer 150b may have a structure in which a tunneling layer 152, a charge storage layer 154, and a blocking layer 156b are sequentially stacked on a channel layer 140.

In detail, in the gate dielectric layer 150b o FIG. 5B, the blocking layer 156b may include first and second blocking layers 156b1 and 156b2. The first blocking layer 156b1 may extend vertically in the same manner as the channel layer 140, and the second blocking layer 156b2 may surround at least a portion of the gate electrode 132. In example embodiments, the first blocking layer 156b1 may be a dielectric layer with a relatively low dielectric constant, and the second blocking layer 156b2 may be a layer with a high dielectric constant. In this case, the first blocking layer 156b1 may be disposed on a side of the second blocking layer 156b2, to control an energy band such as a barrier height, thereby improving semiconductor device characteristics such as, for example, erase characteristics.

With reference to FIG. 5C, a gate electrode 132, a gate dielectric layer 150c, and a channel layer 140 of a memory cell string are illustrated. The gate dielectric layer 150c may comprise a tunneling layer 152c, a charge storage layer 154c, and a blocking layer 156c that are sequentially stacked on a channel layer 140.

In detail, in the gate dielectric layer 150c of FIG. 5C, each of the tunneling layer 152c, the charge storage layer 154c, and the blocking layer 156c may surround at least a portion of the gate electrode 132.

Figure 6:
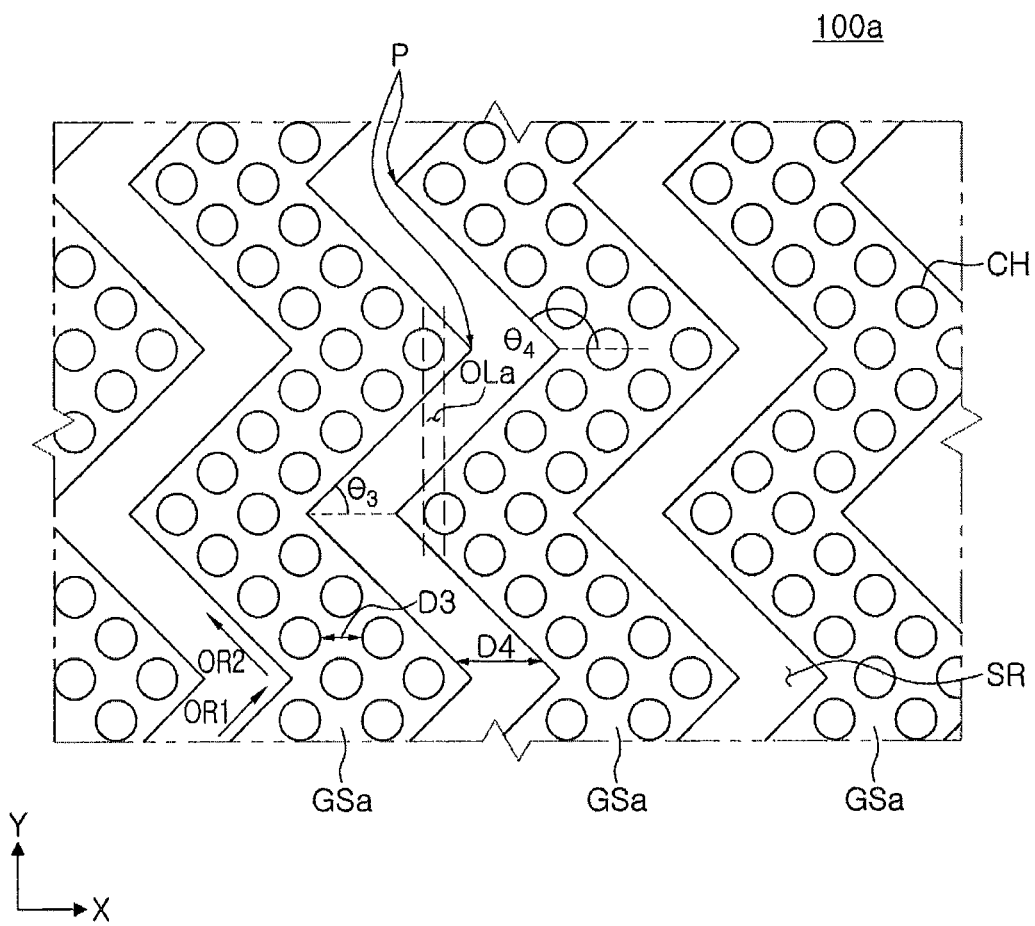
FIGS. 6 to 8 are schematic plan views of semiconductor devices according to exemplary embodiments of the inventive concepts.
Figure 7:
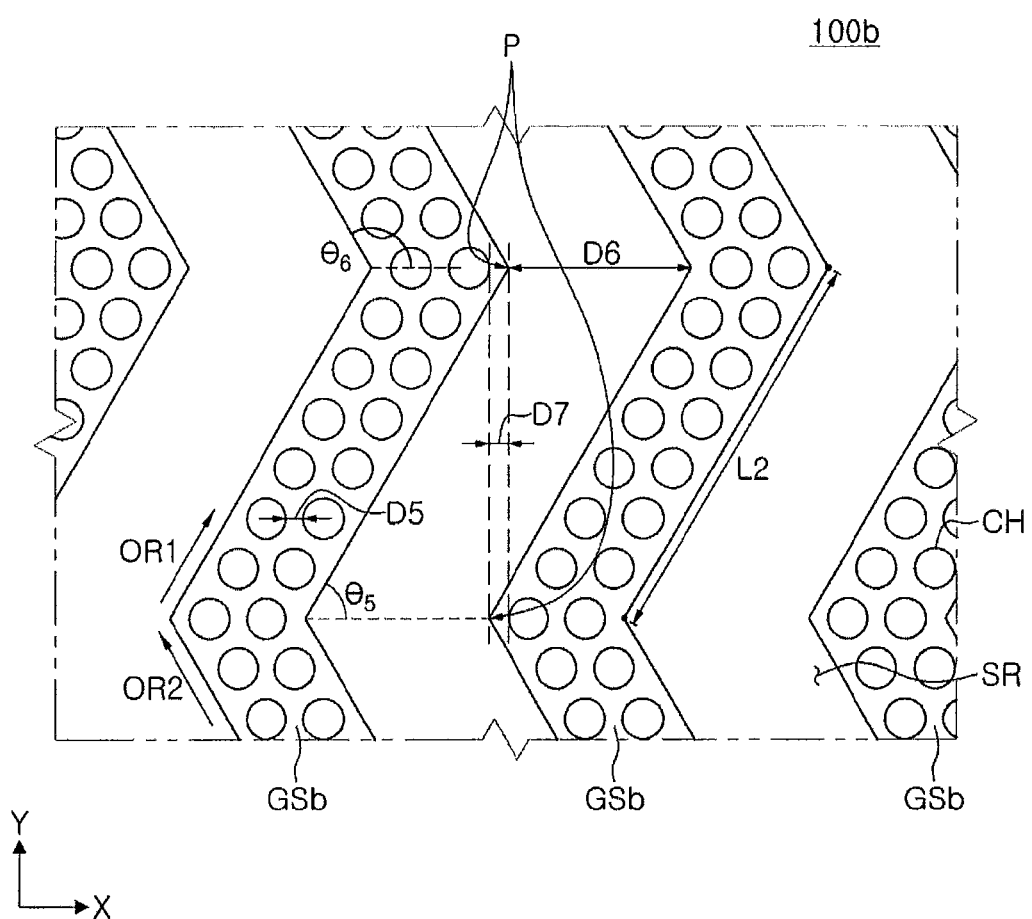
Figure 8:
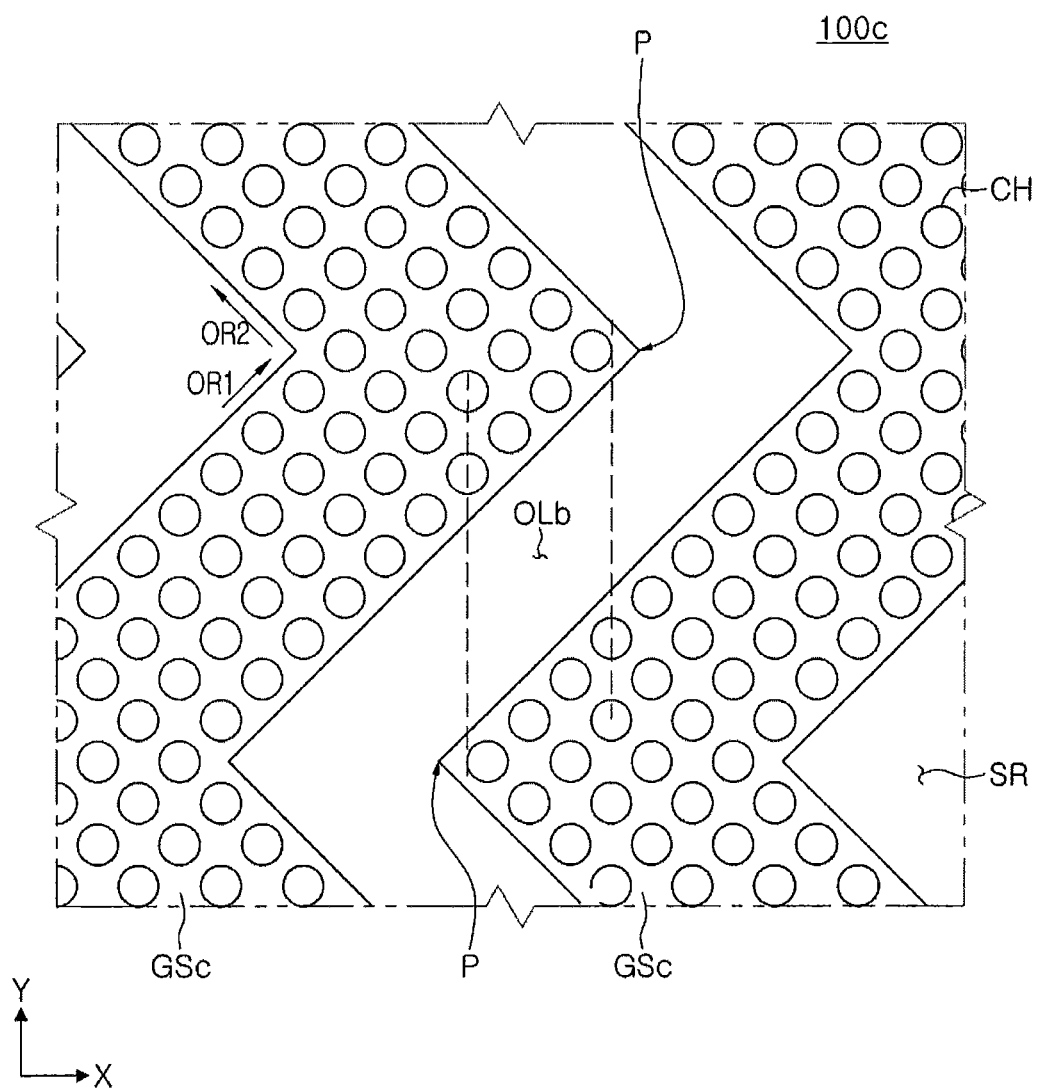

FIGS. 6 to 8 are schematic plan views of semiconductor devices according to further example embodiments of the inventive concepts.

With reference to FIG. 6, a semiconductor device 100a may include gate stack portions GSa, a plurality of channel regions CH that vertically penetrate the gate stack portions GSa, and source regions SR. The gate stack portions GSa and the source regions SR each extend in the same direction, for example, the Y direction, and each source region SR may be disposed between two adjacent gate stack portions GSa.

The gate stack portions GSa may extend in a first direction OR1 while forming a third angle θ3 with respect to the X direction and may extend in a second direction OR2 while forming a fourth angle θ4 with respect to the X direction. The third and fourth angles θ3 and 04 may be different from first and second angles θ1 and θ2 of the exemplary embodiment illustrated with reference to FIG. 3, respectively. For example, the third angle θ3 may be greater than the first angle θ1 and the fourth angle θ4 may be less than the second angle θ2. A distance D3 between channel regions CH that are adjacent each other in the X direction may be less than the distance D2 according to the exemplary embodiment of FIG. 3. The gate stack portions GSa that are adjacent each other in the X direction may be spaced apart from each other so as to have a substantially uniform interval (D4) therebetween in the X direction. The distance D4 may be equal to or different from the distance D1 of the exemplary embodiment of FIG. 3.

The adjacent gate stack portions GSa may have protrusion regions P that alternately protrude in the X direction and in a direction opposite thereto (the −X direction). In the case of the adjacent stack portions GSa, regions including the protrusion regions P or at least a portion of the protrusion regions P may be disposed linearly in the Y direction.

At least a portion of channel regions CH within different gate stack portions GSa may be disposed within a region OLa denoted by dotted lines in FIG. 6. The channel regions CH disposed within the region OLa may be channel regions CH that are disposed in outermost positions of the gate stack portions in the X direction and in the direction opposite thereto.

With reference to FIG. 7, a semiconductor device 100b may include gate stack portions GSb, a plurality of channel regions CH that vertically penetrate the gate stack portions GSb, and source regions SR. The source regions SR may each extend in the Y direction between adjacent gate stack portions GSb.

The gate stack portions GSb may extend in a first direction OR1 at a fifth angle θ5 with respect to the X direction and may extend in a second direction OR2 at a sixth angle θ6. The fifth and sixth angles θ5 and θ6 may be different from the first to fourth angles θ1 to θ4 of the embodiments illustrated with reference to FIGS. 3 and 6. For example, the fifth angle θ5 may be greater than the first and third angles θ1 and θ3, and the sixth angle θ6 may be smaller than the second angle θ2 and the fourth angle θ4. A distance D5 between channel regions CH that are adjacent each other in the X direction may be relatively small, but is not limited thereto.

Gate stack portions GSb that are adjacent each other in the X direction may be spaced apart from each other so as to have a substantially uniform interval therebetween, for example, a distance D6, in the X direction. The distance D6 may be equal to or different from the distance D1 of the embodiment of FIG. 3. In the embodiment of FIG. 7, a length L2 of the gate stack portion GSb that extends continuously in the first or second direction OR1 or OR2 may be greater than a length L1 of gate stack portion GS of the embodiment of FIG. 3.

The adjacent gate stack portions GSb may have protrusion regions P that alternately protrude in the X direction and in the −X direction. In the case of the adjacent stack portions GSb, regions including the protrusion regions P or at least a portion of the protrusion regions P may be disposed linearly in the Y direction.

In a manner different from the embodiments of FIGS. 3 and 6, in the gate stack portions GSb of FIG. 7, as many as 8 channel regions CH may be arranged in the first direction OR1 and the second direction OR2, respectively. Channel regions CH located in different gate stack portions GSb may not be disposed linearly in the Y direction. In other words, in the embodiment of FIG. 7, only portions of the gate stack portions GSb may be disposed linearly in the Y direction, and the closest channel regions CH from adjacent gate stack portions GSb may be spaced apart from each other by a predetermined distance D7 therebetween, but are not limited thereto. For example, in some exemplary embodiments of the present disclosure, channel regions CH located in different gate stack portions GSb may be disposed to contact one virtual linear line that extends in the Y direction or at least a portion thereof may be disposed linearly.

With reference to FIG. 8, a semiconductor device 100c may include gate stack portions GSc, a plurality of channel regions CH that vertically penetrate the gate stack portions GSc, and source regions SR that extend in the Y direction between adjacent gate stack portions GSc.

In the embodiment of FIG. 8, as many as 14 channel regions may be linearly arranged in the first and second directions OR1 and OR2. In addition, the number of channel regions CH linearly arranged in parallel in the X direction may be four in a single gate stack portion GSc. In addition, at least portions of the channel regions CH disposed in different gate stack portions GSc may be disposed together in one region OLb denoted by dotted lines in FIG. 8 in the Y direction.

The adjacent gate stack portions GSc may have protrusion regions P that alternately protrude in the X direction and in the −X direction. A distance between adjacent gate stack portions GSc may be set so that regions including the protrusion regions P or at least portions of the protrusion regions P may be disposed linearly in the Y direction.

Figure 9:
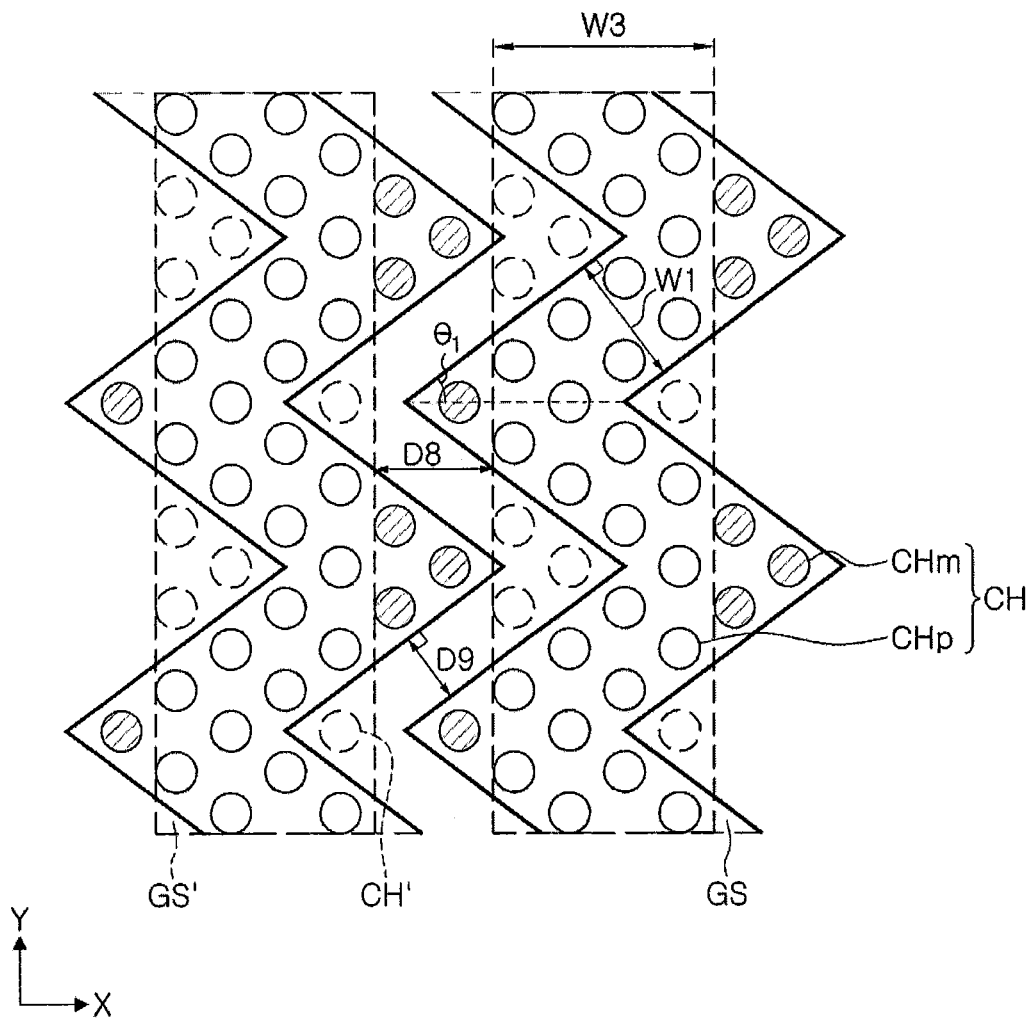
FIG. 9 is a drawing illustrating an arrangement of channel regions in a semiconductor device according to exemplary embodiments of the inventive concepts.

FIG. 9 is a drawing illustrating an arrangement of channel regions in a semiconductor device according to exemplary embodiments of the inventive concepts.

With reference to FIG. 9, a pair of gate stack portions GS according to embodiments of the inventive concepts (shown using the solid lines) that include channel regions CH are illustrated together with a pair of gate stack portions GS' of a comparative example (shown using dotted lines).

The gate stack portions GS' of the comparative example have lateral surfaces that extend linearly in the Y direction, while the gate stack portions GS of the exemplary embodiment of the inventive concepts have lateral surfaces that extend in a zigzag pattern. The number of channel regions CH disposed in the gate stack portions GS may be equal to the number of channel regions disposed in the gate stack portions GS' of the comparative example. In detail, portions of channel regions CH' of the comparative example denoted by a dotted line may be moved in the X direction so as to configure first channel regions CHm among channel regions CH of the exemplary embodiment according to the inventive concepts. The channel regions CH of the exemplary embodiment may form columns in a zigzag pattern, including the first channel regions CHm and second channel regions CHp disposed in the same manner as those of the comparative example. The gate stack portions GS have lateral surfaces that extend in a zigzag pattern to correspond to the of locations of the channel regions CH.

Within the gate stack portion GS' of the comparative example, the channel regions CH' may be arranged in four columns that each extend linearly in the Y direction. These four columns may be classified as an outer region in which two columns adjacent to the lateral edges of the gate stack portion GS' are disposed and an inner region in which the remaining two columns are disposed. The inner and outer regions may have a different shape due to, for example, a deviation of process conditions during the fabrication process. In contrast, the gate stack portions GS according to exemplary embodiments of the inventive concepts may not have a distinction with respect to an outer or inner region, and a problem in which a shape is changed may be avoided.

A minimum width W1 of the gate stack portion GS may be determined based on the first angle θ1. For example, when the first angle θ1 is 30 degrees, the minimum width W1 of the gate stack portion GS may be half of the width W3 of the gate stack portion GS' of the comparative example. Thus, a width of the gate stack portion GS may be reduced while providing the same number of channel regions CH as that of the comparative example.

An area of a region between adjacent gate stack portions GS may be equal to or similar to the case of the comparative example. A minimum distance D9 between adjacent gate stack portions GS may be less than a distance D8 therebetween in the comparative example. On the other hand, according to exemplary embodiments in the present disclosure, an area of a region between the gate stack portions GS or a minimum distance therebetween may also be variously selected in consideration of integration, a thickness of the gate stack portion GS in a Z direction (see FIG. 4), process conditions, and the like.

FIGS. 10 to 17B are drawings schematically illustrating principal processes of a method of fabricating a semiconductor device according to exemplary embodiments of the inventive concepts. In FIGS. 10 to 17B, a region corresponding to an X-Z cross section of the perspective view of FIG. 4 is illustrated.

Figure 10:
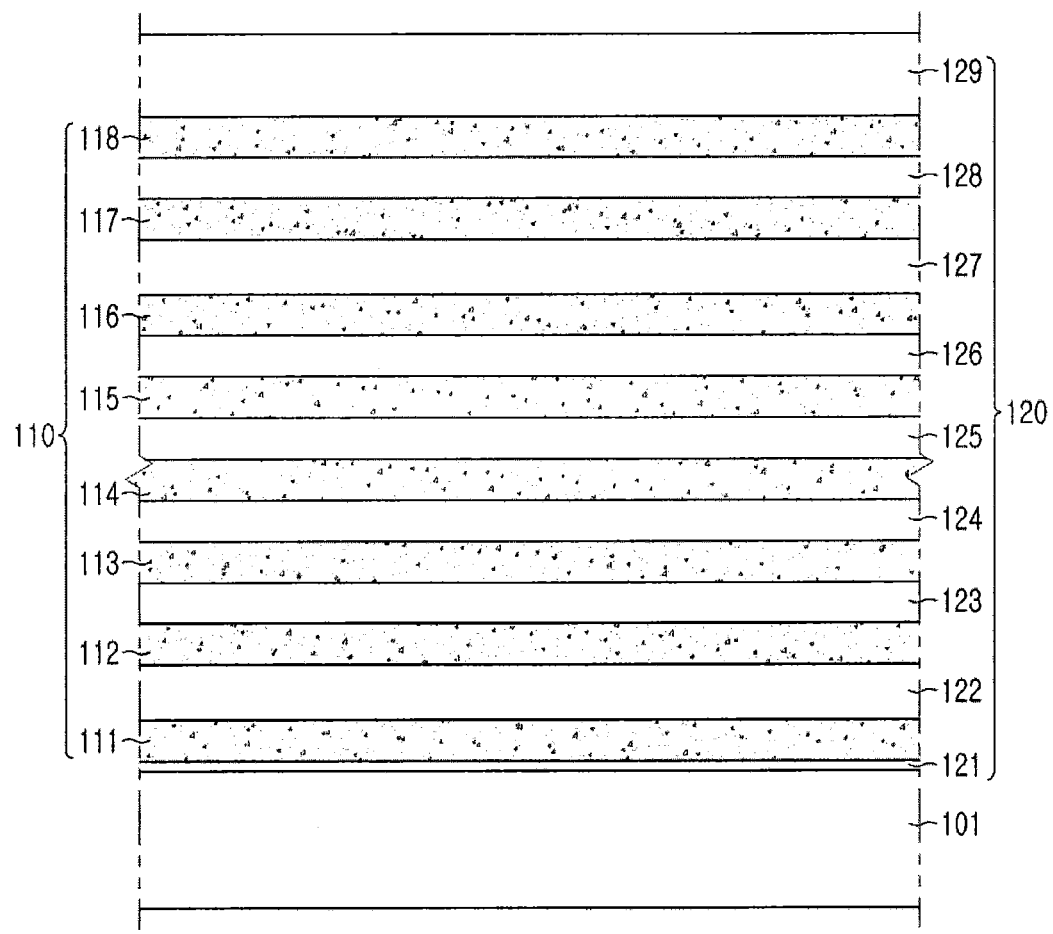
FIGS. 10 to 17B are drawings schematically illustrating a method of fabricating a semiconductor device according to exemplary embodiments of the inventive concepts.

With reference to FIG. 10, sacrificial layers 111 to 118 (110) and interlayer insulating layers 120 may be alternately stacked on a substrate 101.

First, the interlayer insulating layers 120 and the sacrificial layers 110 may be alternately stacked on top of one another so that the first interlayer insulating layer 121 directly contacts the substrate 101. The sacrificial layers 110 may be formed using a material having etching selectivity with respect to the interlayer insulating layers 120. In detail, the sacrificial layers 110 may be formed of a material capable of being selectively etched while significantly minimizing the etching of the interlayer insulating layers 120 during a process of etching the sacrificial layers 110. Such etching selectivity or an etching selection ratio may be quantitatively represented as a ratio of an etching rate of the sacrificial layer 110 with respect to an etching rate of the interlayer insulating layer 120. For example, the interlayer insulating layer 120 may be formed using at least one of silicon oxide and silicon nitride, and the sacrificial layer 110 may be formed using a material that is different from that of the interlayer insulating layer 120, for example, a material selected from silicon, silicon oxide, silicon carbide, and silicon nitride.

As illustrated in the drawings, thicknesses of some of the interlayer insulating layers 120 may be different from thickness of other of the interlayer insulating layers 120. For example, the lowermost interlayer insulating layer 121 may have a relatively thin thickness, and an uppermost interlayer insulating layer 129 may have a relatively thick thickness. In exemplary embodiments, interlayer insulating layers 122 and 127 that are disposed between the ground selection transistors GST and the string selection transistors SST and the memory cells MC1 to MCN of FIG. 2, respectively, may have a thickness greater than those of interlayer insulating layers 123 to 126 that are disposed between the memory cells MC1 to MCN. Thicknesses of the interlayer insulating layers 12Q and the sacrificial layers 110 may be variously changed, not being limited to the thicknesses shown in the drawings. The number of layers interlayer insulating layers 120 and sacrificial layers 110 may also be variously changed.

In some embodiments a predetermined amount of impurities may be doped inside portions of the substrate 101 corresponding to a lower portion of a position of the gate electrode 131 (see FIG. 4) in which the gate electrode 131 is to be disposed, to obtain electrical operation between the source region 105 and the ground selection transistor GST.

Figure 11:
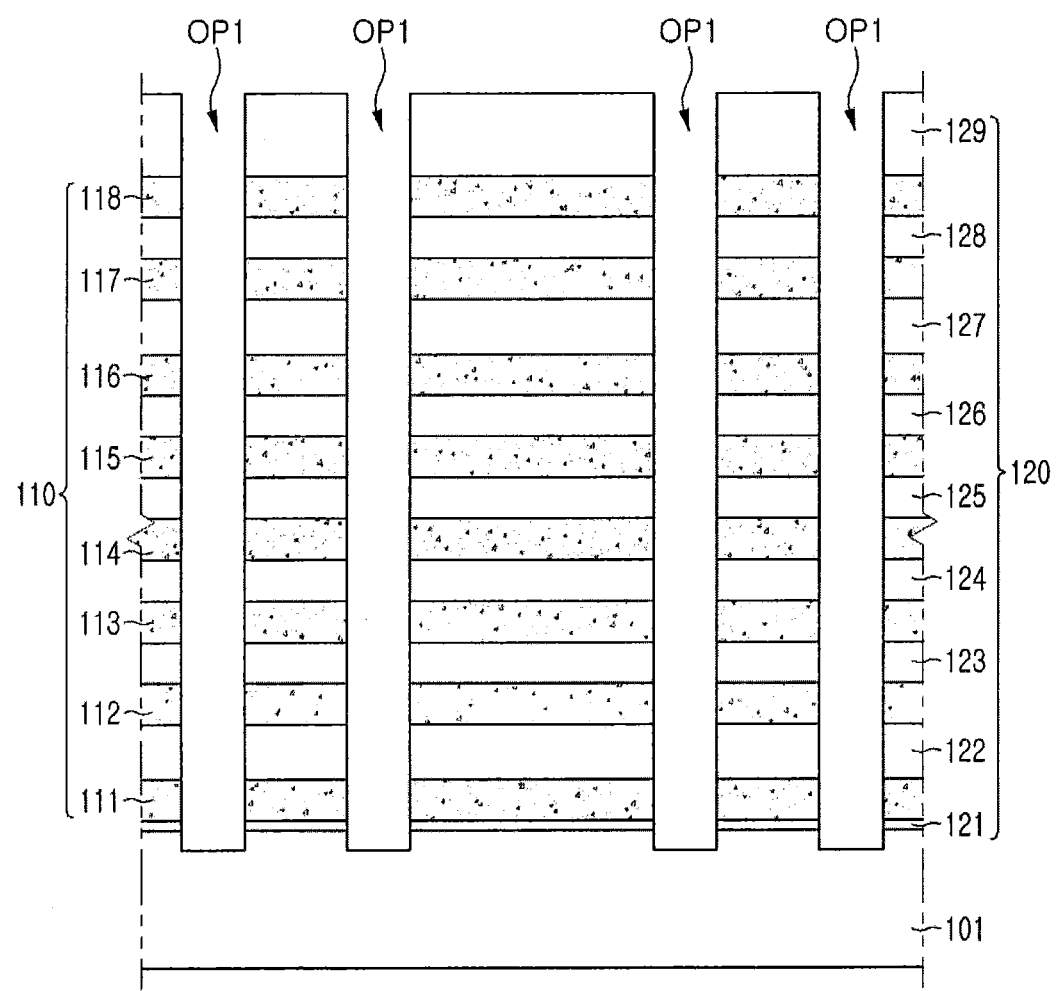

With reference to FIG. 11, first vertical openings OP1 may be formed through the sacrificial layers 110 and the interlayer insulating layers 120 to expose the substrate 101. The first openings OP1 may be formed in locations where the channel regions CH described above with reference to FIGS. 3 and 4 are to be formed.

The first openings OP1 may be formed by anisotropically etching the sacrificial layers 110 and the interlayer insulating layers 120. Since the stack structures including two different types of layers are etched, sidewalls of the first openings OP1 may not be perpendicular to an upper surface of the substrate 101. For example, a width of the first openings OP1 may be reduced with increasing depth (i.e., portions of the first openings that are closer to an upper surface of the substrate 101 may have smaller widths). In some embodiments, the first openings may recess upper portions of the substrate 101.

In some embodiments, an epitaxial layer may further be formed in the recessed regions of the substrate 101. The epitaxial layer may extend higher than a level of an upper surface of a sacrificial layer 111 which is replaced by the gate electrode 131 of the ground selection transistor GST (see FIG. 2).

Figure 12:
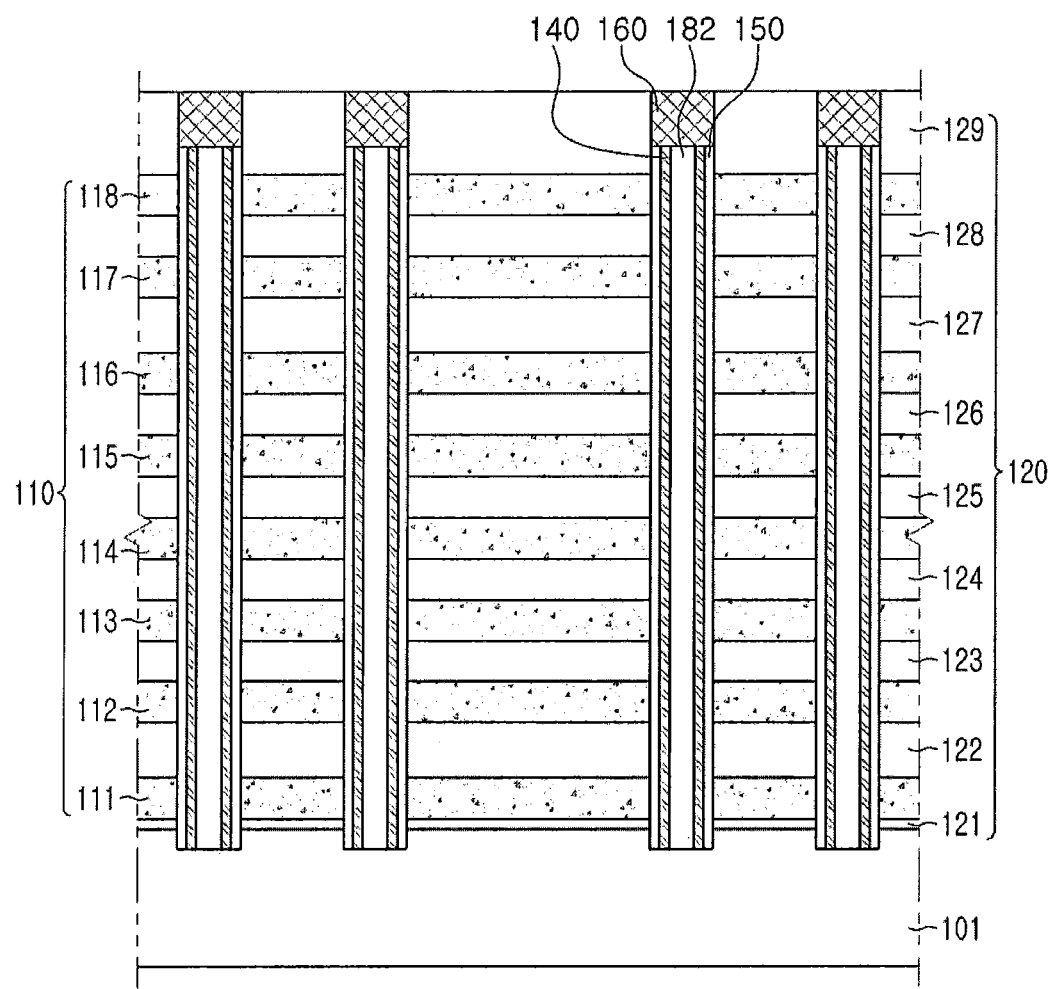

With reference to FIG. 12, gate dielectric layers 150, channel layers 140 and channel pads 160 may be formed within the first openings OP1.

The gate dielectric layer 150 may have a uniform thickness and may be formed via atomic layer deposition (ALD) or chemical vapor deposition (CVD). In the present process, the gate dielectric layer 150 may be completely or only partially formed, and a portion thereof that extends along a length of the channel layer 140 and perpendicular to an upper surface of the substrate 101 may be formed in the present process, as in the exemplary embodiments of the present disclosure with reference to FIGS. 5A to 5C.

In order to allow the channel layer 140 to directly contact the substrate 101, a portion of the gate dielectric layer 150 that is formed on an upper surface of the substrate 101 within the first openings OP1 may be partially removed.

First insulating layers 182 may then be formed that fill the first openings OP1, and may be formed using an insulation material. In some embodiments, a conductive material instead of the first insulating layer 182 may also fill an annular region defined by the channel layers 140.

The channel pads 160 may comprise a conductive material. The channel pads 160 may be electrically connected to respective ones of the channel layers 140, and each channel layer 140 may be electrically connected to a bit line 190 (see FIGS. 17A and 17B) that is formed in a subsequent process.

Figure 13:
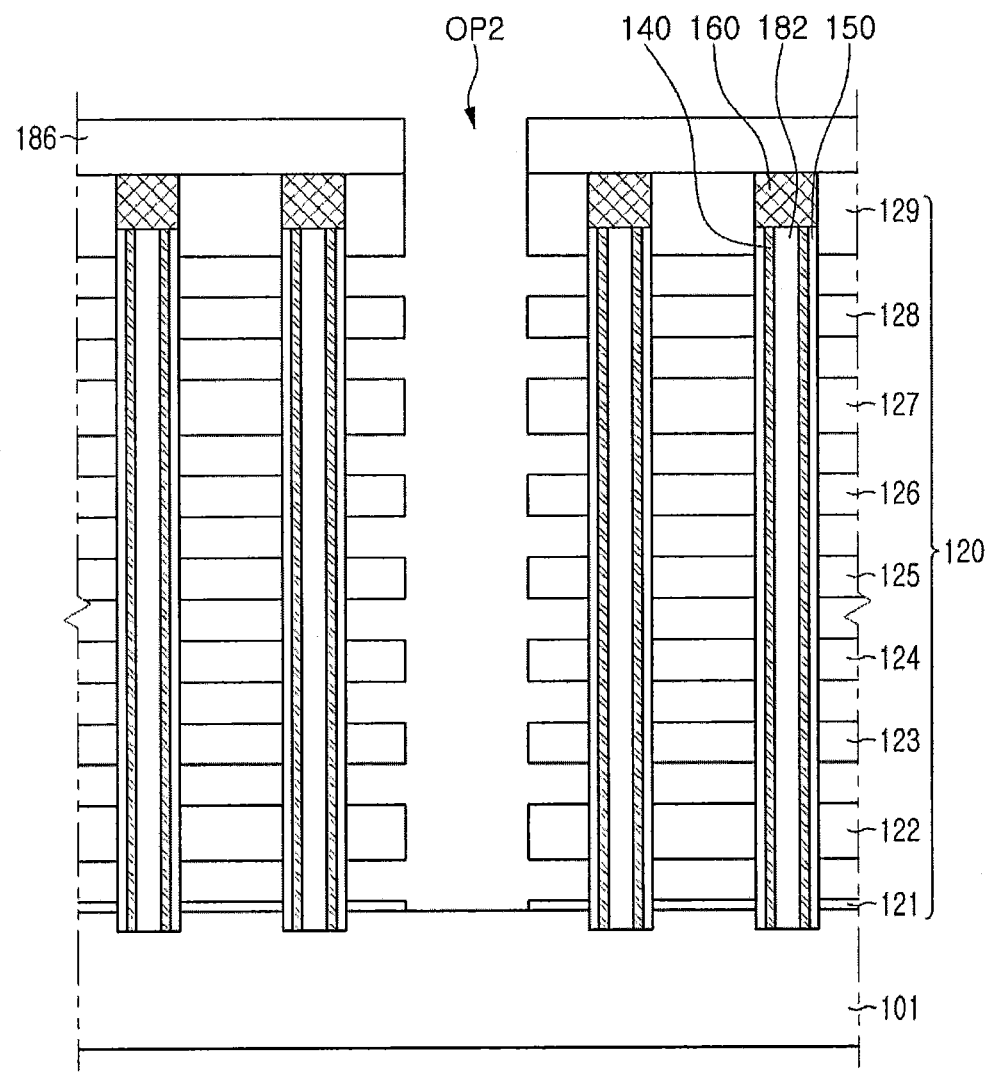

With reference to FIG. 13, a second opening OP2 may be formed that vertically penetrates the sacrificial layers 110 and the interlayer insulating layers 120. The sacrificial layers that are exposed by the second opening OP2 may be removed. Before the second opening OP2 is formed, a third insulating layer 186 may further be formed on an uppermost interlayer insulating layer 129 and the channel pads 160 to prevent the channel pads 160, the channel layers 140 below the channel pads 160, and the like from being damaged during the process used to form the second opening OP2.

The second opening OP2 may be formed by forming a mask layer through a photolithography process and anisotropically etching the sacrificial layers 110 and the interlayer insulating layers 120. The second opening OP2 may be formed to have a zigzag pattern that extends in the Y direction (see FIG. 4). The substrate 101 may be exposed through the second opening OP2 between the channel layers 140. The sacrificial layers 110 may be removed through an etching process to form a plurality of side openings between the interlayer insulating layers 120. Sidewalls of the gate dielectric layers 150 may be partially exposed to the side openings.

As noted above, the second opening OP2 may extend in a zigzag pattern in the Y direction rather than extending in a straight line. Thus, stress applied to the substrate 101 due to the stack structure of the sacrificial layers 110 and the interlayer insulating layers 120 such as, for example, stress applied in a case in which the sacrificial layers include silicon nitride may be released in more than one direction, so that warpage of the substrate 101 may be reduced.

Figure 14:
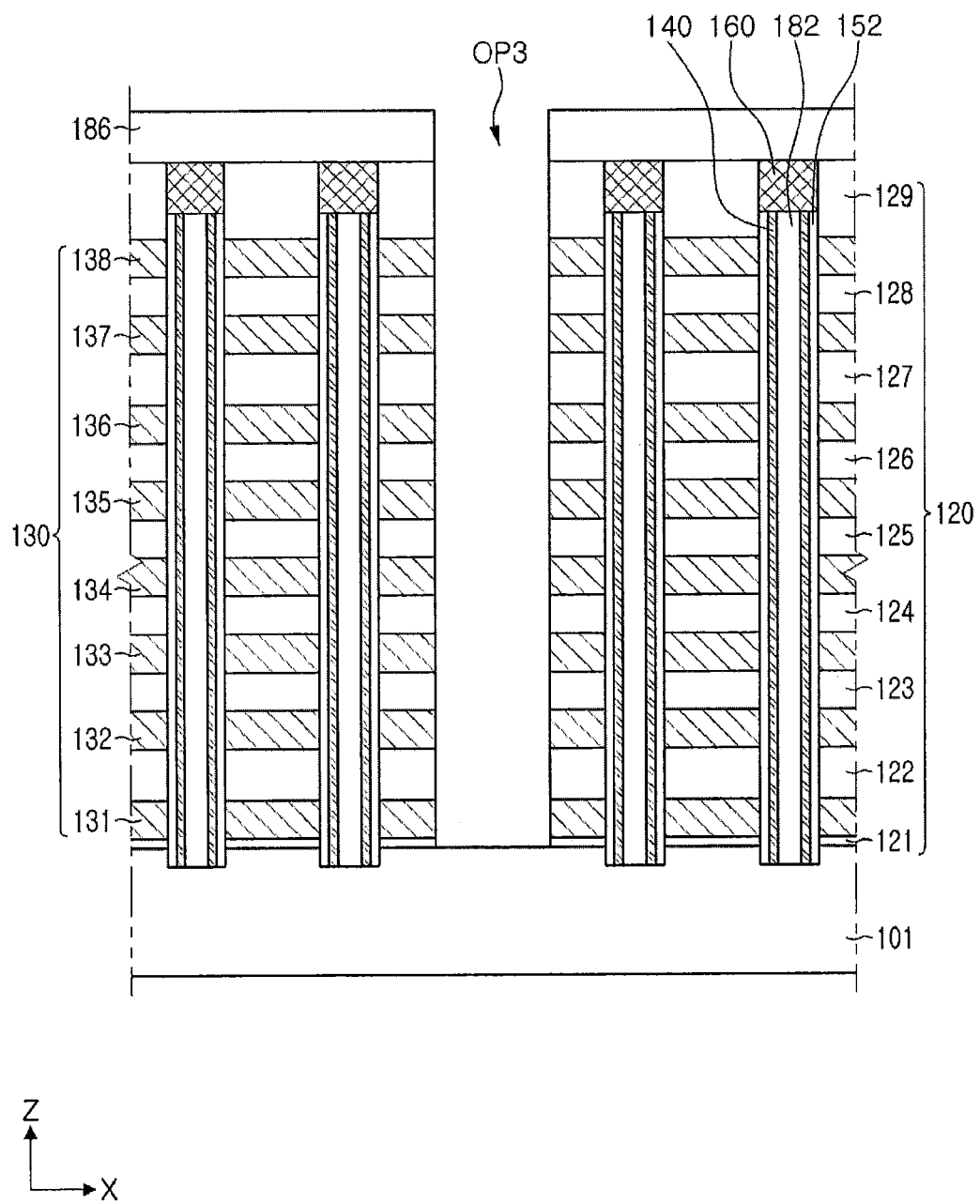

With reference to FIG. 14, gate electrodes 130 may be formed in the side openings in the areas where the sacrificial layers 110 were removed, and a third opening OP3 may be formed.

The gate electrodes 130 may include a metal, polycrystalline silicon, or a metal silicide material. Suitable metal silicide materials include silicides of Co, Ni, Hf, Pt, W and Ti or a combination thereof. When the gate electrodes 130 are formed using a metal silicide material, silicon may fill the side openings and a separate metal layer may then be formed and subjected to a silicidizing process, thereby forming the gate electrodes 130.

After the gate electrodes 130 are formed, excess material used to form the gate electrodes 130 may be removed through an additional process to form the third opening OP3, so that the gate electrodes 130 may only be disposed within the side openings. Such a process may also be performed in a process to be subsequently performed.

As discussed above, the gate stack portion GS (see FIG. 4) of certain embodiments of the inventive concepts may have a relatively narrow width, which may facilitate deposition of the material that is used to form the gate electrodes 130. For example, through the comparison of embodiments according to the inventive concepts with the gate stack portion GS' of the comparative example illustrated in FIG. 9, it can be appreciated that a length of the side openings may be relatively short. In addition, a phenomenon in which a portion of a source material that is used to form the gate electrodes 130 is not completely removed such that it can damage the gate dielectric layer 150 may be prevented or made less likely to occur. Thus, according to exemplary embodiments of the inventive concepts, even in cases in which a thickness of the gate electrodes 130 in the Z direction is relatively small, the gate electrodes 130 may be stably formed. Thus, the thickness of the sacrificial layers 110 may be reduced in the process described above with reference to FIG. 10, and the process may thus be stably performed even in a case in which the number of the gate electrodes 130 is increased.

Figure 15:
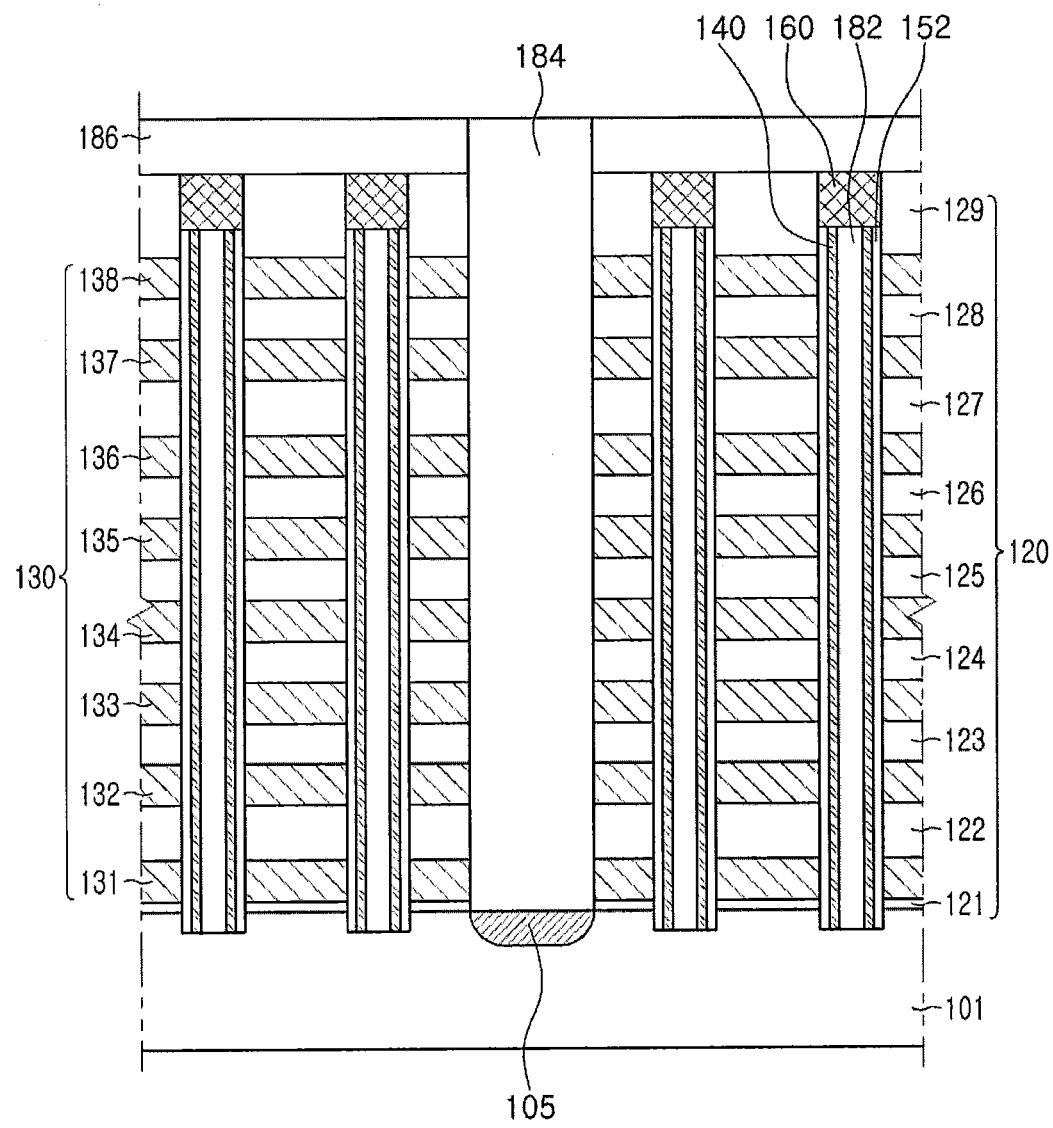
Figure 15:
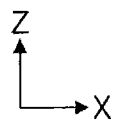

With reference to FIG. 15, a source region 105 may be formed on a portion of the substrate 101 that is exposed by the third opening OP3, and a second insulating layer 184 may be formed on the source region 105.

The source region 105 may be formed by implanting an impurity into the portion of the substrate 101 that is exposed by the third opening OP3. Subsequently, the second insulating layer 184 may be formed on a sidewall of the third opening OP3. In some embodiments, the source region 105 may be formed after the second insulating layer 184 is formed. In some embodiments, a common source line CSL (see FIG. 2) or a contact plug connected to the common source line CSL may further be disposed on the source region 105.

Figure 16A:
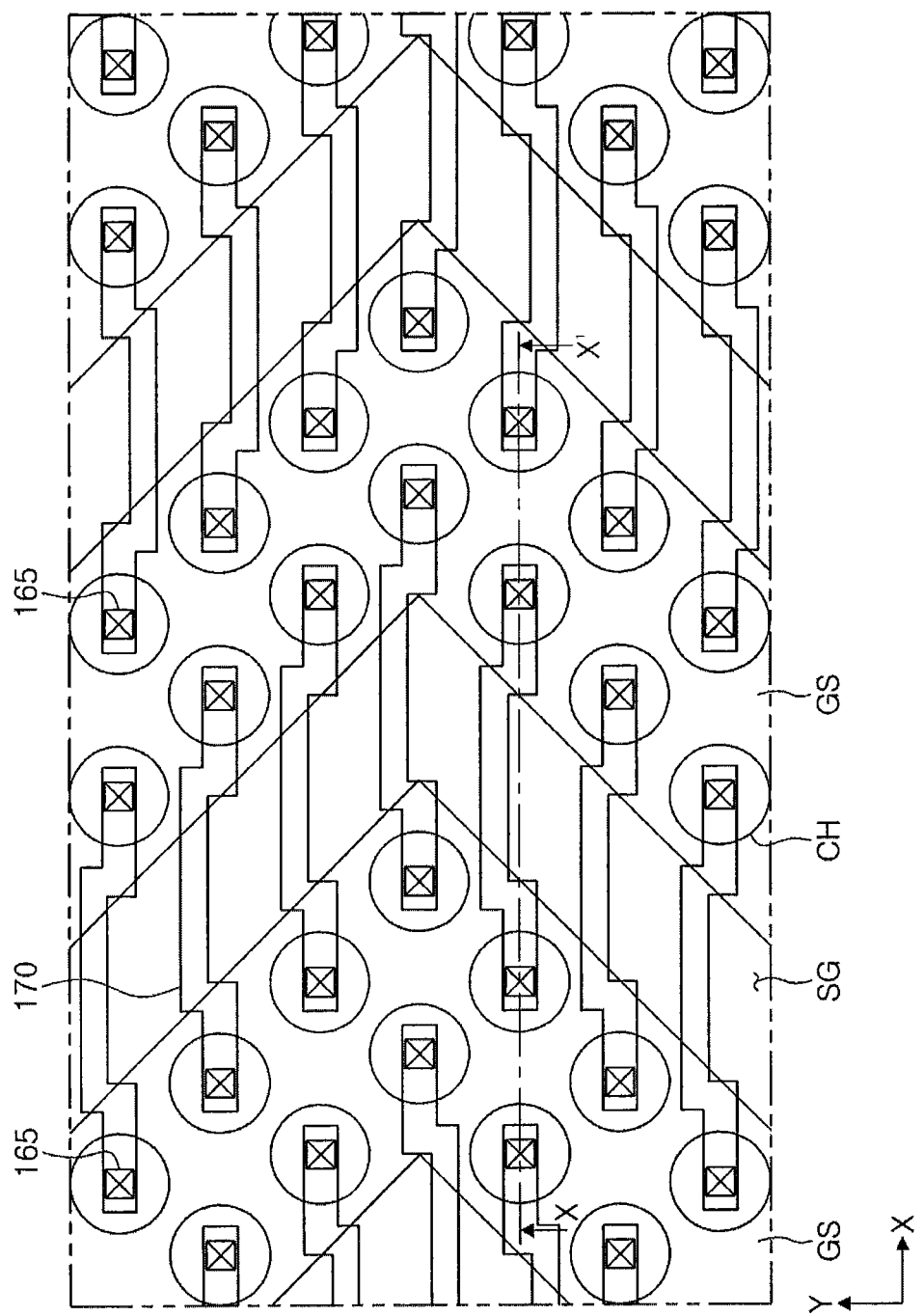
Figure 16B:
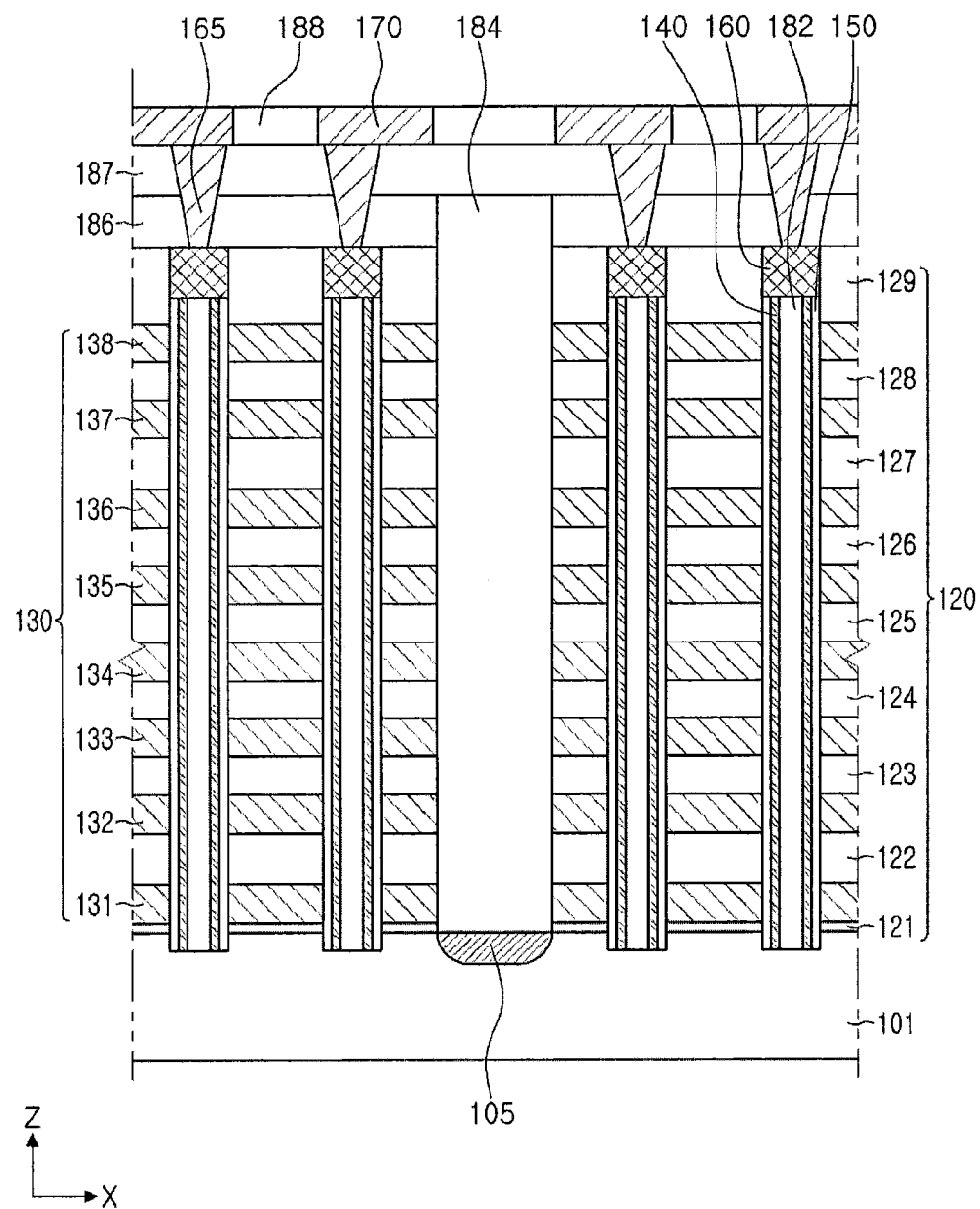

FIG. 16A is a layout diagram that illustrates the first contact plugs 165 and the connection wiring lines 170 according to an example embodiment. FIG. 16B illustrates a cross sectional view taken along line X-X' of FIG. 16A. It will be appreciated that the relative size and detailed shape thereof are not limited to what is shown in FIGS. 16A-16B.

With reference to FIGS. 16A and 16B, first contact plugs 165 and connection wiring lines 170 may be formed. Each first contact plug 165 may be electrically connected to a channel pad 160 and may penetrate through the third and fourth insulating layers 186 and 187. The first contact plugs 165 may be formed by forming a contact hole that penetrates through the third and fourth insulating layers 186 and 187, and a conductive material may then be formed in the contact hole to form the first contact plugs 165.

Next, a fifth insulating layer 188 may be formed, and the connection wiring line 170 may be formed to connect to the first contact plug 165. The connection wiring line 170 may connect first contact plugs 165 to each other. The contact plugs 165 may be formed on upper portions of two channel regions CH that are adjacent each other in the X direction in adjacent gate stack portions GS. In addition, the connection wiring lines 170 that generally extend in the X direction may be bent in directions opposite to each other, for example, in the Y direction and in the −Y direction, as is shown in FIG. 16A. Thus, the connection wiring lines 17Q that each connect channel regions CH that are adjacent each other in the X direction may be bent in directions opposite to each other, respectively, in the Y direction.

The first contact plugs 165 and the connection wiring lines 170 may include a conductive material, for example, tungsten (W), aluminum (Al), or copper (Cu).

Figure 17A:
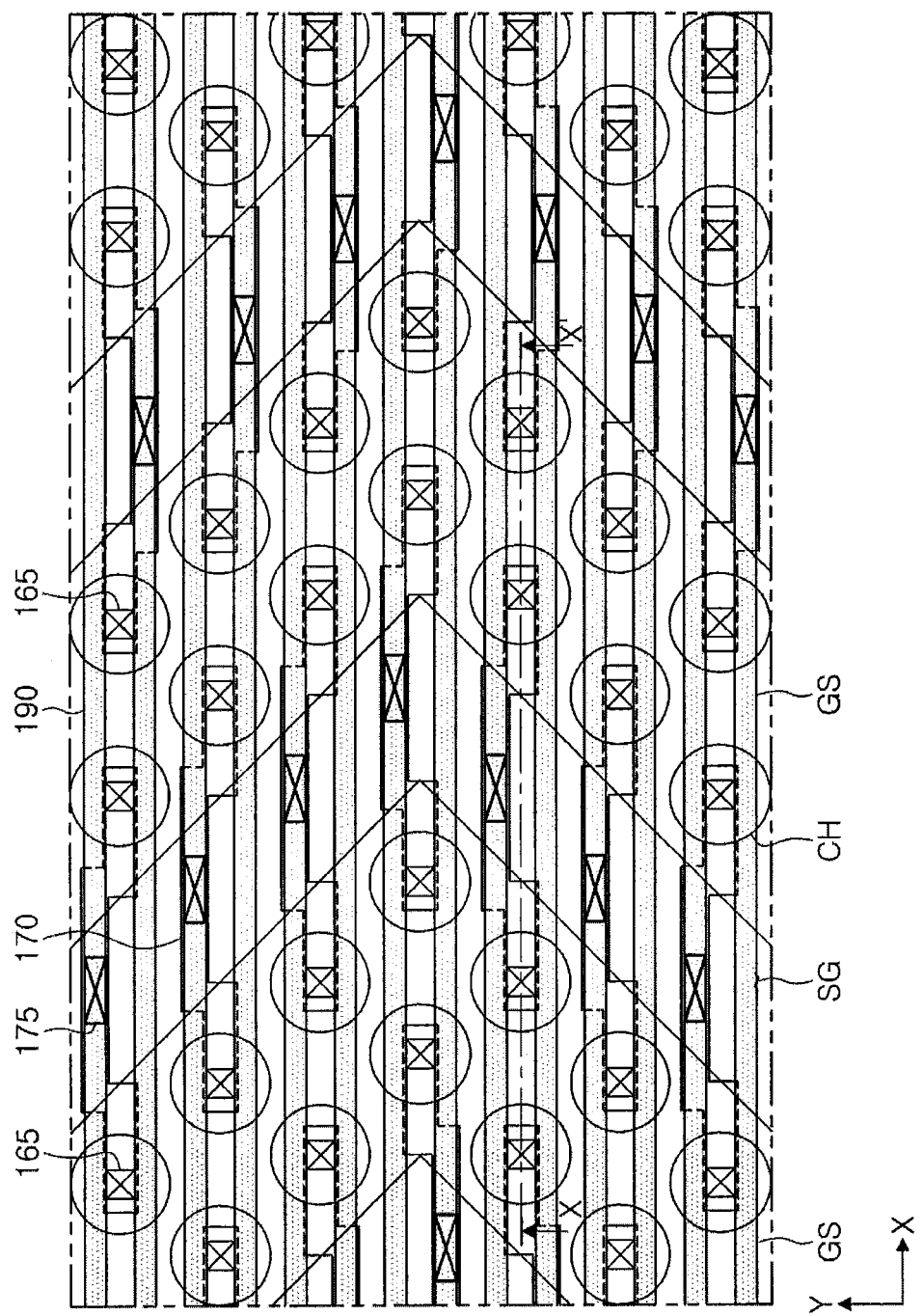
Figure 17B:
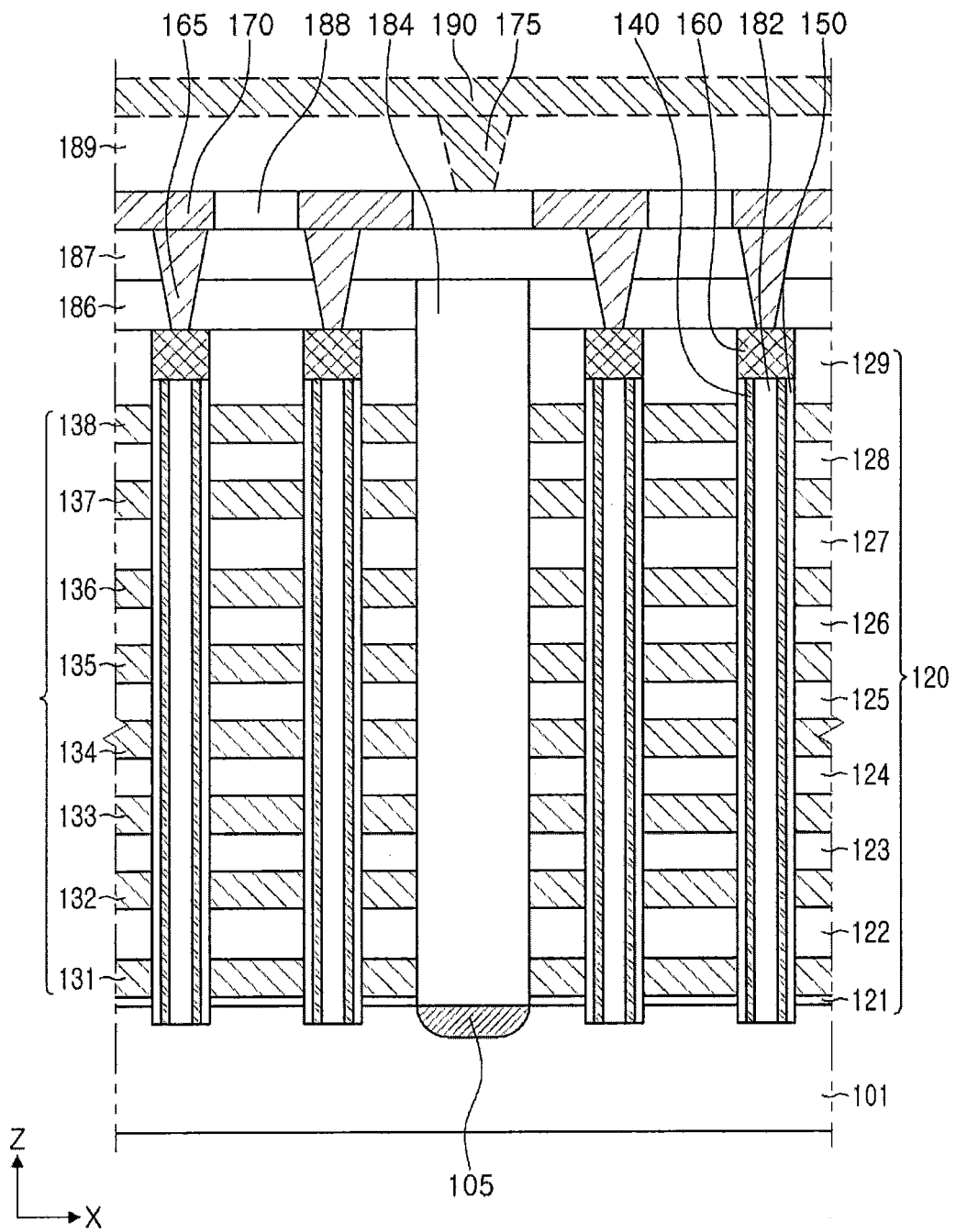

FIG. 17A is a layout diagram that illustrates second contact plugs 175 and bit lines 190 according to an example embodiment. FIG. 17B is a cross-sectional view taken along line X-X' of FIG. 17A. It will be appreciated that the relative size and detailed shape are not limited to what is shown in FIGS. 17A-17B.

With reference to FIGS. 17A and 17B, second contact plugs 175 and bit lines 190 may be formed. A fifth insulating layer 189 may be formed on the connection wiring lines 170, and the second contact plugs 175 may be formed to penetrate the fifth insulating layer 189 and to contact respective ones of the connection wiring lines 170. Each second contact plug 175 may be connected to at least a portion of a corresponding connection wiring line 170. The second contact plugs 175 may be formed by forming contact holes that penetrate the fifth insulating layer 189 and then depositing a conductive material inside the contact holes.

Next, an insulating layer (not shown in the drawings) may be formed and the bit lines 190 may be formed. The bit lines 190 may extend in the X direction and may be connected to at least a portion of the second contact plugs 175. In such a wiring structure, for example, when one gate stack portion GS and one bit line 190 are selected, only one memory cell string including one channel region CH will be selected.

The second contact plugs 175 and the bit lines 190 may include a conductive material, for example, tungsten (W), aluminum (Al), or copper (Cu).

Figure 18:
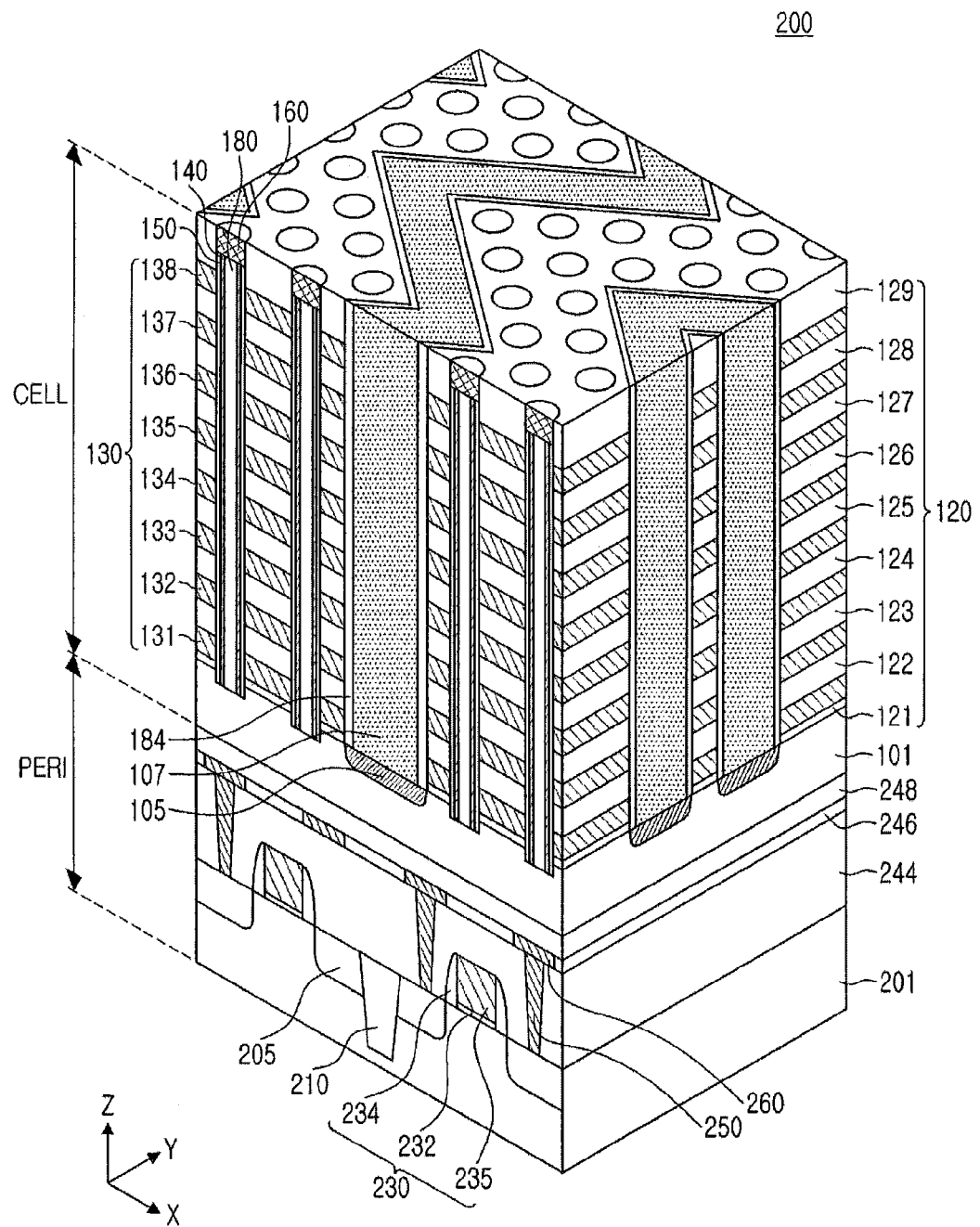
FIG. 18 is a schematic perspective view of a semiconductor device according to exemplary embodiments of the inventive concepts.

FIG. 18 is a schematic perspective view of a semiconductor device 200 according to an exemplary embodiment of the inventive concepts.

With reference to FIG. 18, the semiconductor device 200 may include a cell region CELL and a peripheral circuit region PERI.

The memory cell array 20 of FIG. 1 is in the cell region CELL, and the driving circuit 30 of FIG. 1 is in the peripheral circuit region PERI. The cell region CELL may be disposed on an upper portion of the peripheral circuit region PERI. In other embodiments, the cell region CELL may be below the peripheral region PERI.

The cell region CELL may include a substrate 101, a plurality of channel layers 140 that are disposed to be perpendicular to an upper surface of the substrate 101, a plurality of interlayer insulating layers 120 and a plurality of gate electrodes 130 stacked along outer sidewalls of the channel layers 140 in a direction perpendicular to the upper surface of the substrate 101 (the Z direction). The cell region CELL may further include a gate dielectric layer 150 that is disposed between the channel layer 140 and the gate electrode 130, a common source line 107 that is disposed on an upper portion of the source region 105, and channel pads 160 that are provided on respective upper portions of the channel layers 140. The common source line 107 may include tungsten (W), aluminum (Al), or copper (Cu).

In FIG. 18, the cell region CELL is illustrated as having the same structure as the exemplary embodiment of FIG. 4, except for the addition of the common source line 107, but is not limited thereto. The cell region CELL may include a semiconductor device according to various exemplary embodiments of the inventive concepts as described above with reference to FIGS. 5A to 17B.

The peripheral circuit region PERI may include a base substrate 201, circuit devices 230 disposed on the base substrate 201, contact plugs 250, and wiring lines 260.

The base substrate 201 may have an upper surface that extends in the X direction and in the Y direction. A device isolation layer 210 may be formed in the base substrate 201 to define an active region. A doped region 205 that includes impurities may be disposed in a portion of the active region. The base substrate 201 may include a semiconductor material, for example, a group IV semiconductor material, a group III-V compound semiconductor material, or a group II-VI oxide semiconductor material. For example, the group IV semiconductor may include silicon, germanium, or silicon-germanium. The base substrate 201 may be provided as a bulk wafer or an epitaxial layer.

The circuit device 230 may include a planar transistor. The circuit device 230 may include a circuit gate insulating layer 232, a spacer layer 234, and a circuit gate electrode 235. Doping regions 205 may be disposed at both sides of the circuit gate electrode 235 within the base substrate 201 to serve as a source region or a drain region of the circuit device 230.

A plurality of peripheral region insulating layers 244, 246, and 248 may be disposed on the circuit device 230 on an upper portion of the base substrate 201. The peripheral region insulating layer 244 may include a high density plasma (HDP) oxide layer to efficiently fill a gap between the plurality of circuit devices 23Q.

The contact plugs 250 may penetrate the peripheral region insulating layer 244 to connect to the doping region 205. An electrical signal may be applied to the circuit devices 230 via the contact plugs 250. In a region not shown in the drawings, the contact plugs 250 may also be connected to the circuit gate electrodes 235. The wiring lines 260 may be connected to the contact plugs 25Q and may be disposed in a plurality of layers in exemplary embodiments.

The peripheral circuit region PERI may be formed first, and the cell region CELL may then be formed by forming the substrate 101 of the cell region CELL thereon. The substrate 101 may have the same size as the base substrate 201 or may be smaller than the base substrate 201. The substrate 101 may comprise polycrystalline silicon or may be single-crystallized after being formed using amorphous silicon.

The cell region CELL and the peripheral circuit region PERI may be connected to each other in a region not shown in the drawings. For example, one end of the gate electrode 130 in the Y direction may be electrically connected to the circuit device 230.

A semiconductor device 200 may be implemented as a miniaturized device by allowing the cell region CELL and the peripheral circuit region PERI to be vertically arranged. Channel regions including the channel layer 14Q may be arranged in columns to have a zigzag pattern, and the gate stack portion including the gate electrodes 130 may have a lateral surface that has a zigzag pattern so that a thickness of the gate electrodes 130 may be reduced. Thus, an overall thickness of the semiconductor device 200 may be decreased.

Figure 19:
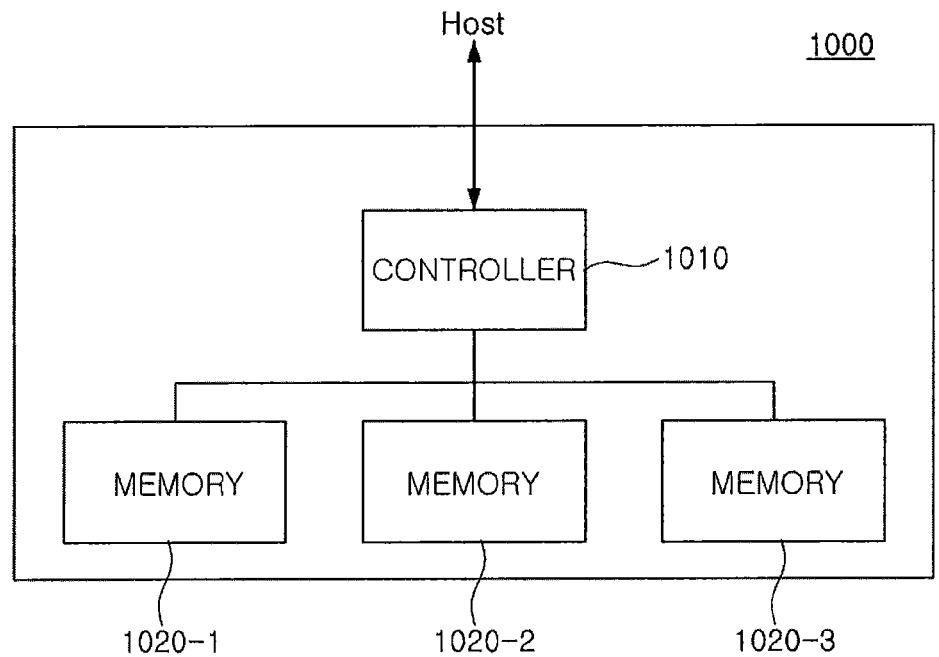
FIG. 19 is a block diagram of a storage apparatus that includes semiconductor devices according to exemplary embodiments of the inventive concepts.

FIG. 19 is a block diagram of a storage apparatus 1000 that includes semiconductor devices according to exemplary embodiments of the inventive concepts.

With reference to FIG. 19, the storage apparatus 1000 may include a controller 1010 that communicates with a host HOST, and memories 1020-1, 1020-2, and 1020-3 that store data therein. The memories 1020-1, 1020-2, and 1020-3 may include a semiconductor device according to various exemplary embodiments of the inventive concepts as described above with reference to FIGS. 1 to 18.

The host HOST communicates with the controller 1010 and may be various electronic devices in which the storage apparatus 1000 is installed such as, for example, a smartphone, a digital camera, a desktop computer, a laptop computer, a media player, or the like. The controller 1010 may receive a request to read or write data that is transferred by the host HOST to enable data to be written to the memories 102Q-1, 1020-2, and 1020-3 or may generate a command (CMD) to allow data to read from the memories 1020-1, 1020-2, and 1020-3.

As illustrated in FIG. 19, the memories 1020-1, 1020-2, and 1020-3 may be connected to the controller 1010 in parallel within the storage apparatus 1000. A storage apparatus 1000 having a large capacity as in a solid state driver (SSD) may be implemented by connecting the plurality of memories 1020-1, 1020-2, and 1020-3 to the controller 1010 in parallel.

Figure 20:
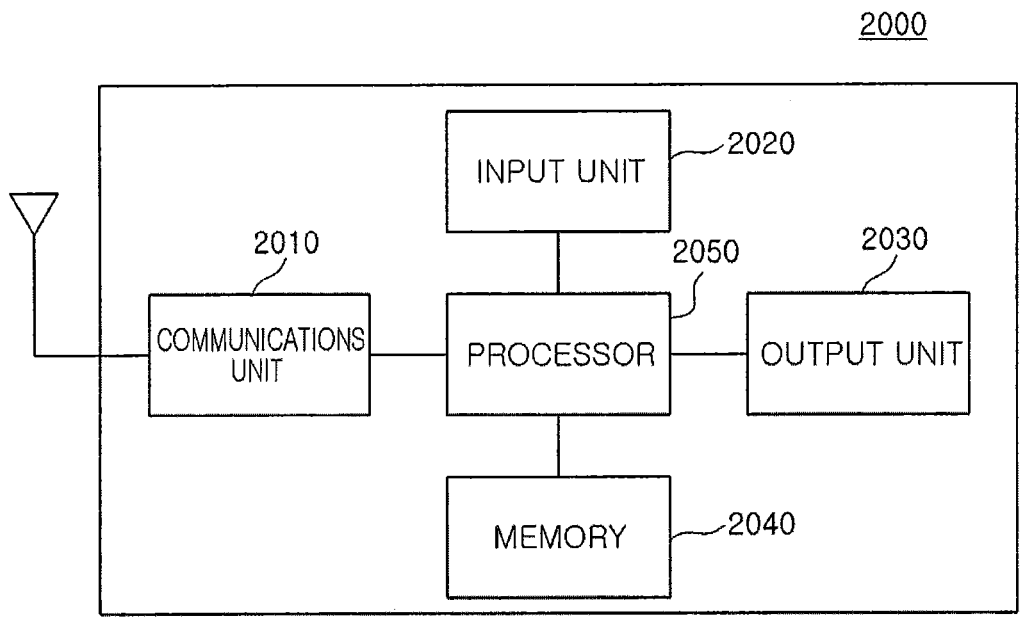
FIG. 20 is a block diagram of an electronic device that includes semiconductor devices according to exemplary embodiments of the inventive concepts.

FIG. 20 is a block diagram of an electronic device 2000 that includes semiconductor devices according to exemplary embodiments of the inventive concepts.

With reference to FIG. 20, the electronic device 2000 includes a communications unit 2010, an input unit 2020, an output unit 2030, a memory 2040, and a processor 2050.

The communications unit 2010 may include a wired and wireless communications module and may include a wireless internet module, a near-field communications module, a global positioning system (GPS) module, a mobile communications module, and the like. The wired and wireless communications module included in the communications unit 2010 may be connected to an external communications network via various communications protocols to transmit or receive data.

The input unit 2020 may be a module provided to control operations of the electronic device 2000 by a user, and may include a mechanical switch, a touchscreen, a sound recognition module, and the like. In addition, the input unit 2020 may also include a mouse operating in a trackball or laser pointer scheme, or a finger mouse device, and also, may further include various sensor modules through which data may be input by a user.

The output unit 2030 may output information processed by the electronic device 2000 in audio or visual form, and the memory 2040 may store a program, data, or the like. The memory 2040 may include one or more semiconductor devices according to various exemplary embodiments of the inventive concepts as described above with reference to FIGS. 1 to 18. The processor 2050 may transfer a command to the memory 2040 according to a required operation to write data thereto or read data therefrom.

The memory 2040 may be embedded in the electronic device 2000 or may communicate with the processor 205Q via a separate interface. In the case of communicating with the processor 2050 via the separate interface, the processor 2050 may write data to the memory 2040 or read data therefrom via various interface standards such as SD, SDHC, SDXC, MICRO SD, USB, and the like.

The processor 2050 may control operations of various modules of the electronic device 2000. The processor 2050 may control and process data relevant to voice communication, video communication, data communications, and the like, or may also control and process data for multimedia playback and management. In addition, the processor 2050 may process an input transferred through the input unit 2020 by a user and may output the result thereof via the output unit 203Q. In addition, the processor 2050 may write data required to control operations of the electronic device 2000 to the memory 2040 or read data therefrom.

Figure 21:
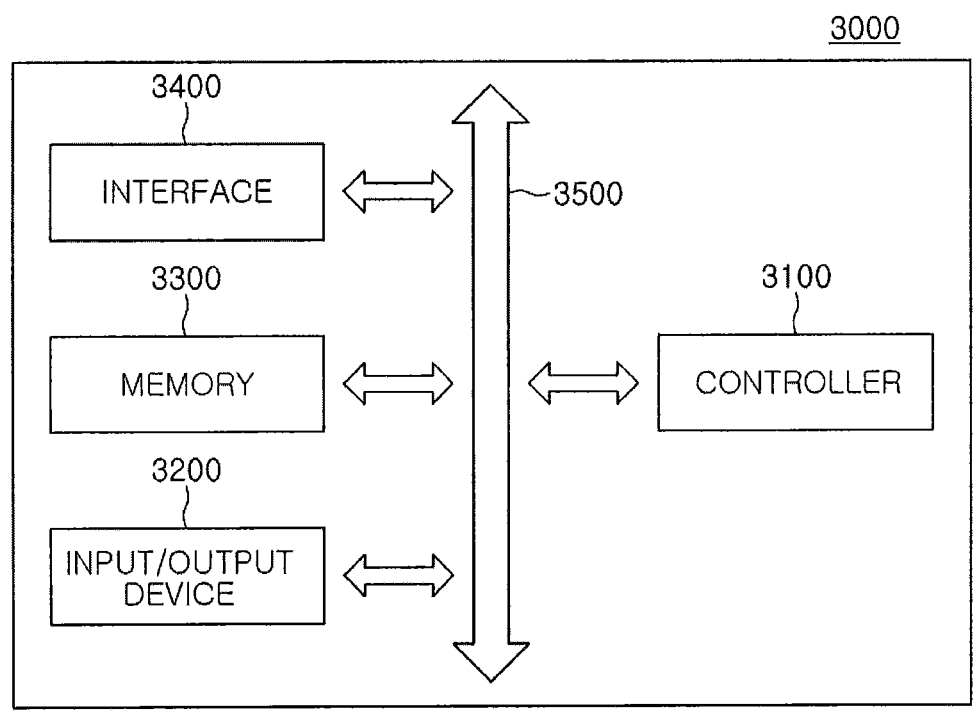
FIG. 21 is a schematic view of a system that includes semiconductor devices according to exemplary embodiments of the inventive concepts.

FIG. 21 is a schematic view of a system 3000 that includes semiconductor devices according to exemplary embodiments of the inventive concepts.

With reference to FIG. 21, the system 3000 may include a controller 3100, an input/output device 3200, a memory 3300, and an interface 3400. The system 3000 may be a mobile system or a system transmitting or receiving information. The mobile system may be provided as a personal digital assistant (PDA), a portable computer, a web tablet, a wireless phone, a mobile phone, a digital music player or a memory card.

The controller 3100 may execute a program and may serve to control the system 3000. The controller 3100 may be provided as, for example, a microprocessor, a digital signal processor, a microcontroller or a device similar thereto.

The input/output device 3200 may be used to input or output data of the system 3000. The system 3000 may be connected to an external device, for example, a personal computer or a network to exchange data therebetween using the input/output device 3200. The input/output device 3200 may be provided as, for example, a keypad, a keyboard, or a display.

The memory 3300 may store a code and/or data for operations of the controller 3100, and/or may store data processed by the controller 310Q therein. The memory 3300 may include semiconductor devices according to the inventive concepts.

The interface 3400 may serve as a data transmission path between the system 3000 and an external, different device.

The controller 3100, the input/output device 3200, the memory 3300, and the interface 3400 may communicate with one another via a bus 3500.

At least one of the controller 310Q or the memory 3300 may include one or more semiconductor devices as described above with reference to FIGS. 1 to 18.

According to exemplary embodiments of the inventive concepts, semiconductor devices having improved reliability may be provided that have channel regions that are arranged in columns in a zigzag pattern.

While exemplary embodiments have been shown and described above, it will be apparent to those skilled in the art that modifications and variations could be made without departing from the scope of the present disclosure as defined by the appended claims.

What is claimed is:

1. A semiconductor device comprising:
a substrate having an upper surface that extends in first and second directions that are perpendicular to each other;
first and second gate stack portions that are spaced apart from each other in the first direction, the first and second gate stack portions including gate electrodes that are spaced apart from each other in a third direction that is perpendicular to the upper surface of the substrate, the first and second gate stack portions having lateral surfaces that extend in the second direction in a zigzag pattern;
channel regions that penetrate the first and second gate stack portions, the channel regions arranged in columns that extend in the second direction in the zigzag pattern, wherein the first gate stack portion and the second gate stack portion each includes at least two channel regions that are linearly arranged in the first direction; and
a source region disposed between the first and second gate stack portions, the source region extending in the second direction in a zigzag pattern.

2. The semiconductor device of claim 1, wherein the zigzag pattern extends in the second direction, and wherein the lateral surfaces of the first and second gate stack portions extend in fourth and fifth directions, each of which is inclined with respect to both the first direction and the second direction.

3. The semiconductor device of claim 1, wherein the first and second gate stack portions are positioned so that a virtual line that extends in the second direction intersects both the first and second gate stack portions.

4. The semiconductor device of claim 3, wherein the channel regions include a first channel region in the first gate stack portion and a second channel region in the second gate stack portion, and
wherein at least portions of the first channel region and the second channel region are linearly disposed in the second direction.

5. The semiconductor device of claim 4, wherein the first channel region is positioned in an outermost portion of the first gate stack portion along the first direction and the second channel region is positioned in an outermost portion of the second gate stack portion along a direction opposite to the first direction.

6. The semiconductor device of claim 1, wherein the number of channel regions that are linearly disposed in the first direction is 2n in each of the first and second gate stack portions, n being a natural number.

7. The semiconductor device of claim 1, wherein the channel regions that penetrate the first gate stack portion are linearly arranged alternately in fourth and fifth directions that are different from the first and second directions, and
wherein the channel regions that penetrate the second gate stack portion are linearly arranged alternately in fourth and fifth directions.

8. The semiconductor device of claim 7, wherein the number of the channel regions that are continuously linearly arranged in the fourth direction or in the fifth direction is five or more in each of the first and second gate stack portions.

9. The semiconductor device of claim 7, wherein the numbers of the channel regions that are continuously linearly arranged in the fourth direction and in the fifth direction are equal to each other in the first gate stack portion and in the second gate stack portion.

10. The semiconductor device of claim 1, wherein each of the first and second gate stack portions include a plurality of first protrusion regions that each protrudes in the first direction and a plurality of second protrusion regions that each protrudes in a direction opposite to the first direction, and
wherein the first and second protrusion regions are alternately disposed in the second direction.

11. The semiconductor device of claim 1, wherein the source region is in the substrate,
the semiconductor device further comprising a common source line on the source region that extends in the second direction in a zigzag pattern.

12. The semiconductor device of claim 1, further comprising:
a plurality of channel pads on upper portions of the respective channel regions;
a plurality of first contact plugs that are connected to the respective channel pads;
a plurality of connection wiring lines each of which is connected to at least one of the first contact plugs;
a plurality of second contact plugs that are connected to respective ones of the connection wiring lines; and
a plurality of bit lines that are connected to respective ones of the second contact plugs, the bit lines extending in the first direction.

13. The semiconductor device of claim 12, wherein each of the connection wiring lines connect a respective one of the channel regions that is located within the first gate stack portion to a respective one of the channel regions that is located within the second gate stack portion.

14. The semiconductor device of claim 12, wherein each bit line is electrically connected to only one channel region in the first gate stack portion and to only one channel region in the second gate stack portion.

15. A semiconductor device comprising:
a substrate having an upper surface that extends in a first direction and a second direction that is perpendicular to the first direction;
a gate stack portion including gate electrodes that are spaced apart from each other in a third direction that is perpendicular to the upper surface of a substrate, the gate stack portion extending in the second direction in a zigzag pattern; and
channel regions that penetrate the gate stack portion to extend to the upper surface of the substrate, the channel regions arranged in columns that extend in a zigzag pattern in the second direction, at least two of the channel regions being disposed linearly in the first direction.

16. A three-dimensional semiconductor memory device, comprising:
a substrate that has an upper surface that extends in a first direction and a second direction that is perpendicular to the first direction;
a plurality of gate stack portions, each gate stack portion including a plurality of channel regions that extend upwardly from the upper surface of the substrate, each gate stack portion having lateral surfaces that extend in the second direction in a zigzag pattern; and a plurality of source regions, each source region separating adjacent ones of the gate stack portions, each source region extending in the second direction in a zigzag pattern.

17. The three-dimensional semiconductor memory device of claim 16, wherein the channel regions in each gate stack portion are arranged in linear rows that extend in the first direction.

18. The three-dimensional semiconductor memory device of claim 16, wherein the lateral surfaces of each gate stack pattern alternately extend in a fourth direction that is inclined by an angle of less than ninety degrees with respect to the first direction and in a fifth direction that is inclined by an angle of more than ninety degrees with respect to the first direction.

19. The three-dimensional semiconductor memory device of claim 18, wherein five or more channel regions are continuously linearly arranged in the fourth direction in each of the gate stack patterns.

20. The three-dimensional semiconductor memory device of claim 16, wherein adjacent gate stack portions are positioned so that a virtual line that extends in the second direction intersects both adjacent gate stack portions.

* * * * *